United States Patent
Chuang et al.

(10) Patent No.: US 11,067,389 B2
(45) Date of Patent: Jul. 20, 2021

(54) OVERLAY METROLOGY SYSTEM AND METHOD

(71) Applicant: KLA-Tencor Corporation, Milpitas, CA (US)

(72) Inventors: Yung-Ho Alex Chuang, Cupertino, CA (US); Yinying Xiao-Li, San Jose, CA (US); John Fielden, Los Altos, CA (US); Xuefeng Liu, San Jose, CA (US); Peilin Jiang, Santa Clara, CA (US)

(73) Assignee: KLA Corporation, Milpitas, CA (US)

( * ) Notice: Subject to any disclaimer, the term of this patent is extended or adjusted under 35 U.S.C. 154(b) by 296 days.

(21) Appl. No.: 15/952,081

(22) Filed: Apr. 12, 2018

(65) Prior Publication Data
US 2019/0285407 A1 Sep. 19, 2019

Related U.S. Application Data

(60) Provisional application No. 62/642,501, filed on Mar. 13, 2018.

(51) Int. Cl.
*G01B 11/27* (2006.01)

(52) U.S. Cl.
CPC ........ *G01B 11/272* (2013.01); *G01B 2210/56* (2013.01)

(58) Field of Classification Search
CPC .............. G01B 11/272; G01B 2210/56; G03F 7/70633
USPC .......................................... 702/150; 356/445
See application file for complete search history.

(56) References Cited

U.S. PATENT DOCUMENTS

| | | |
|---|---|---|
| 4,999,014 A | 3/1991 | Gold et al. |
| 5,181,080 A | 1/1993 | Fanton et al. |
| 5,608,526 A | 3/1997 | Piwonka-Corle et al. |
| 5,877,036 A * | 3/1999 | Kawai ................. G03F 7/70633 438/16 |
| 5,877,859 A | 3/1999 | Aspnes et al. |
| 5,999,310 A | 12/1999 | Shafer et al. |
| 6,297,880 B1 | 10/2001 | Rosencwaig et al. |

(Continued)

FOREIGN PATENT DOCUMENTS

KR 20170015453 A 2/2017

OTHER PUBLICATIONS

U.S. Appl. No. 62/111,421, filed Jan. 3, 2015, Zhuang et al.
(Continued)

*Primary Examiner* — John H Le
(74) *Attorney, Agent, or Firm* — Suiter Swantz pc llo

(57) ABSTRACT

A system for measuring an overlay error of a sample is disclosed. The system may include a broadband illumination source configured to emit broadband illumination. The system may also include one or more optical elements configured to direct the broadband illumination to a target disposed on the sample, wherein the one or more optical elements are configured to collect illumination from the target and direct it to a spectrometer, wherein the spectrometer is configured to disperse multiple wavelengths of the illumination collected from the sample to multiple elements of a sensor to generate a plurality of signals. The system may also include a controller configured to calculate an overlay error between a first structure and a second structure of the target by comparing the plurality of signals with a plurality of calculated signals.

29 Claims, 6 Drawing Sheets

(56) References Cited

U.S. PATENT DOCUMENTS

| | | | |
|---|---|---|---|
| 6,429,943 B1 | 8/2002 | Opsal et al. | |
| 7,242,477 B2 | 7/2007 | Mieher et al. | |
| 7,245,438 B2 | 7/2007 | Chuang et al. | |
| 7,449,265 B1* | 11/2008 | Dixon | G03F 7/70625 |
| | | | 257/797 |
| 7,474,461 B2 | 1/2009 | Chuang et al. | |
| 7,525,649 B1 | 4/2009 | Leong et al. | |
| 7,608,468 B1* | 10/2009 | Ghinovker | G03F 7/70633 |
| | | | 438/16 |
| 7,705,331 B1 | 4/2010 | Kirk et al. | |
| 7,817,260 B2 | 10/2010 | Chuang et al. | |
| 7,957,066 B2 | 6/2011 | Armstrong et al. | |
| 8,441,639 B2 | 5/2013 | Kandel et al. | |
| 8,618,254 B2 | 12/2013 | Giaccia et al. | |
| 8,873,054 B2 | 10/2014 | Kandel et al. | |
| 9,080,971 B2 | 7/2015 | Kandel et al. | |
| 9,228,943 B2 | 1/2016 | Wang et al. | |
| 9,255,887 B2 | 2/2016 | Brunner | |
| 9,279,774 B2 | 3/2016 | Romanovsky et al. | |
| 9,470,639 B1 | 10/2016 | Zhuang et al. | |
| 9,645,287 B2 | 5/2017 | Brunner | |
| 9,709,510 B2 | 7/2017 | Kolchin et al. | |
| 9,723,703 B2 | 8/2017 | Bezel et al. | |
| 9,726,617 B2 | 8/2017 | Kolchin et al. | |
| 9,865,447 B2 | 1/2018 | Chuang et al. | |
| 9,891,177 B2 | 2/2018 | Vazhaeparambil et al. | |
| 2007/0002465 A1 | 1/2007 | Chuang et al. | |
| 2007/0105029 A1* | 5/2007 | Ausschnitt | G03F 7/70691 |
| | | | 430/30 |
| 2009/0180176 A1 | 7/2009 | Armstrong et al. | |
| 2010/0091284 A1 | 4/2010 | Mieher et al. | |
| 2011/0035235 A1 | 2/2011 | Hale et al. | |
| 2012/0089365 A1* | 4/2012 | Fay | G01B 11/0675 |
| | | | 702/167 |
| 2012/0224176 A1 | 9/2012 | Hammond | |
| 2013/0110477 A1 | 5/2013 | Pandev | |
| 2013/0114085 A1 | 5/2013 | Wang et al. | |
| 2016/0091422 A1* | 3/2016 | Van Der Zouw | G03F 7/70633 |
| | | | 356/445 |
| 2016/0117847 A1 | 4/2016 | Pandev et al. | |
| 2018/0321597 A1* | 11/2018 | Javaheri | G03F 7/70625 |

OTHER PUBLICATIONS

U.S. Appl. No. 62/642,501, filed Mar. 13, 2018, Yung-Ho Alex Chuang et al.

N. P. Smith et al., "Overlay metrology at the crossroads", Proc. SPIE, vol. 6922, Mar. 2008, pp. 692203.

Fanton et al., "Multiparameter Measurements of Thin Films Using Beam-Profile Reflectivity," Journal of Applied Physics, vol. 73, No. 11, p. 7035, 1993.

Leng et al., "Simultaneous Measurement of Six Layers in a Silicon on Insulator Film Stack Using Spectrophotometry and Beam Profile Reflectometry," Journal of Applied Physics, vol. 81, No. 8, p. 3570, 1997.

M. Adel et al., "Diffraction order control in overlay metrology—a review of the roadmap options", Proc. of SPIE, vol. 6922, Mar. 2008, pp. 692202.

International Search Report and Written Opinion dated Dec. 24, 2018 for PCT/US2018/033061.

* cited by examiner

OVERLAY METROLOGY SYSTEM AND METHOD

CROSS-REFERENCE TO RELATED APPLICATIONS

The present application claims the benefit under 35 U.S.C. § 119(e) of U.S. Provisional Application Ser. No. 62/642,501, filed Mar. 13, 2018 entitled "OVERLAY METROLOGY SYSTEM AND METHOD," naming Yung-Ho Alex Chuang, Yinying Xiao-Li, John Fielden, Xuefeng Liu, and Peilin Jiang as inventors, which is incorporated herein by reference in the entirety.

TECHNICAL FIELD

The present application relates generally to overly metrology, and, in particular, to the determination of overlay between structures formed in single or multiple layers of a semiconductor wafer stack suitable for use in overlay metrology systems.

BACKGROUND

The integrated circuit (IC) industry requires inspection tools with increasingly higher sensitivity to detect ever smaller defects and particles, and requires high precision metrology tools for accurately measuring the dimensions of small features on semiconductor wafers. The semiconductor industry is currently manufacturing semiconductor devices with feature dimensions of approximately 20 nm and smaller. Within a few years, the industry will be manufacturing devices with feature dimensions of approximately 5 nm. Particles and defects just a few nanometers in size can reduce wafer yields, while changes in feature dimensions and alignment of a few tenths of one nanometer or less can cause a significant change in the electrical performance, or failure, of a transistor or memory device.

In the field of semiconductor metrology, a metrology tool may comprise an illumination system which illuminates a target, a collection system which captures relevant information provided by the illumination system's interaction (or lack thereof) with a target, device or feature, and a processing system which analyzes the information collected using one or more algorithms. Metrology processes are performed on wafers at various points in a semiconductor manufacturing process to measure a variety of characteristics of the wafers such as a width of a patterned structure on the wafer, a thickness of a film formed on the wafer, and overlay of patterned structures on one layer of the wafer with respect to patterned structures on another layer of the wafer. These measurements are used to facilitate process controls and/or yield efficiencies in the manufacture of semiconductor dies. Optical critical dimension (CD) metrology is currently performed using either spectroscopic scatterometry or angle-resolved scatterometry. Film metrology is performed using spectroscopic ellipsometry. Optical overlay metrology is performed using either imaging methods or scatterometry-based methods (both spectroscopic and angle-resolved). Overlay metrology tools for the semiconductor and related industries are manufactured by KLA-Tencor Corporation (e.g., the Archer 500 LCM), by ASML Holding N.V. (e.g., the YieldStar S-250D), and other companies.

In various manufacturing and production environments, there is a need to control alignment between various layers of samples, or within particular layers of such samples. For example, in the semiconductor manufacturing industry, electronic devices may be produced by fabricating a series of layers on a substrate, some or all of the layers including various structures. The relative position of such structures both within particular layers and with respect to structures in other layers is relevant or even critical to the performance of completed electronic devices. This relative position of structures within such a sample is called overlay.

The measurement of overlay error between successive patterned layers on a wafer is one of the most critical process control techniques used in the manufacturing process of integrated circuits and devices. Overlay accuracy generally pertains to the determination of how accurately a first patterned layer aligns with respect to a second patterned layer disposed above or below it and to the determination of how accurately a first pattern aligns with respect to a second pattern disposed on the same layer.

Overlay error should be within approximately 20% of the smallest dimension in the patterns for semiconductor devices to work properly according to the International Technology Roadmap for Semiconductors (ITRS). The total measurement uncertainty (TMU) required in the overlay data is much smaller than the process tolerance. There are several contributors to TMU. Measurement consistency is evaluated in terms of precision and tool-induced shift (TIS), which is the difference in overlay measurements that result when the wafer is rotated by 180° and re-measured in the same overlay metrology tool. Other contributors to TMU may also include variance between measured data and the best fit to patterning tool models, discrepancies in measurements between overlay metrology tools, and differences in results from identical adjacent targets.

The overlay metrology error budget is typically divided into two broad categories: random errors and systematic errors. Random errors result from statistical uncertainties with the three primary sources being noise due to photon and electron fluctuations, measurement position repeatability due to mechanical vibrations, and process noise. Process noise refers to the impact of process variations, such as film stack properties, edge roughness, and granularity which vary from site to site on the reticle and wafer. It can be argued that for any individual metrology event this is a systematic error source. However, in the case of overlay metrology such variations affect the measurement focus position and interact with tool imperfections to contribute to TIS and tool matching errors.

There are many possible sources of systematic errors which may be attributed to specific architectural elements. With respect to the illumination system, illumination non-uniformity and signal contamination between cells are potential contributors. With respect to the collection subsystem, chromatic and asymmetric aberrations of the optical column must be considered. Furthermore, in the detection plane, signal contamination between cells and fixed noise from the image sensor itself may contribute errors. Finally, certain families of algorithms may also introduce systematic biases to the error budget. Algorithmic errors are inherent due to the limited number of cells. A good design of the target/algorithm combination can minimize this error source but it cannot be reduced to zero. As opposed to random errors, an important consideration with respect to systematic errors is that in some cases they may be compensated for, if a simple metric is accessible, as is the case with TIS. It is therefore important to differentiate between compensable and non-compensable error sources, when building an error budget and designing the metrology system.

The advancement in process node reduction is accompanied by an increasing need in controlling the process overlay budget to a tighter extent. With the introduction of multi-patterning techniques in the semiconductor industry, the number of layers involved in the lithography stack has increased significantly. More lithography layers and complex stacks are expected to be used as multiple pitch splitting technologies are validated for high volume IC manufacturing. As a result, the ability to align many layers at once has become more and more challenging in recent years. For semiconductor manufacturing, pattern alignment often requires sub-nanometer uncertainty. The overlay process tolerance is being reduced much faster than the rate at which critical feature dimensions are shrinking. In the past, the alignment tree was set so that every layer aligns to one layer and, at the most, was measured against two layers, such as Contact to Poly and Isolation. Today, even at the 20-nm node there are double and triple patterning for critical layers such as Isolation, Poly, Contact, and Metal 1. This forces a much more complex alignment tree and overlay measurement. Layers are sometimes aligned to an average of previous layers, to different layers at different orientations, and disposition is done based on several measurements. This growing challenge increases the number of overlay measurements significantly, increases the target area, and presents the need to make many measurements from different layers consistent. Overlay metrology tools need to measure ever increasing numbers of overlay targets at each lithography step on more layers, while maintaining reasonable cost of ownership. The cost per measurement is considered both in measurement time and in the amount of silicon real-estate being utilized by the metrology.

Various technologies and processes for measuring overlay have been developed and employed with varying degrees of success (see for instance, N. P. Smith, L. A. Binns, A. Plambeck, and K. Heidrich, "Overlay metrology at the crossroads", Proc. Of SPIE, Vol. 6922, March 2008, pp. 692203). More recently, various efforts have been focused on utilizing radiation scatterometry as a basis for overlay metrology (see for instance, U.S. Pat. No. 7,242,477 and M. Adel, D. Kandel, V. Levinski, J. Seligson, and A. Kuniaysky, "Diffraction order control in overlay metrology—a review of the roadmap options", Proc. Of SPIE, Vol. 6922, March 2008, pp. 692202). Diffraction-based analysis techniques such as scatterometry are especially well suited for microelectronics metrology applications because they are nondestructive, sufficiently accurate, repeatable, rapid, simple, and inexpensive relative to critical dimension-scanning electron microscopy (CD-SEM).

Certain existing approaches to determining overlay from scatterometry measurements concentrate on comparing the measured spectra to calculated theoretical spectra based on model shape profiles, overlay, film stack, and material optical properties (e.g., n and k dispersion curves), or by comparing measured signals to a reference signal from a calibration wafer.

Existing approaches have several associated disadvantages. For example, a relatively large number of parameters must be included in the profile, overlay, and film modeling to accurately determine the overlay. For instance, in some approaches using simple trapezoidal models for both the upper and lower layer profiles, the minimum number of pattern parameters that must be included is seven, including overlay. If film thicknesses variation is included in the model, the number of parameters increases correspondingly. A large number of parameters could require increased processing resources, may introduce corresponding errors, and may delay the results, thereby possibly decreasing throughput and increasing inefficiencies and costs. For example, comparison of a measured spectrum to calculated reference spectra takes longer with more parameters, whether a library-based approach is used or a regression approach is used.

Another disadvantage of certain existing approaches to determination of overlay based on scatterometry is the detailed knowledge of the film stack, film materials, and pattern element profiles that may be required to determine accurate theoretical spectra to be compared against measured spectra.

Yet another disadvantage of certain existing approaches to determination of overlay based on scatterometry is the accurate knowledge of the scatterometry optical system that may be required to determine accurate theoretical spectra to be compared against measured spectra.

Most existing scatterometers are designed to measure multiple incident angles at a single wavelength on periodic gratings (i.e. angle-resolved scatterometry). Nevertheless, semiconductor metrology tools are most useful if they can measure on all, or most, of the different materials and structures used in CMOS manufacturing. Different materials and structures have very different reflectivities from one another.

Therefore, in light of the deficiencies of existing approaches to determination of overlay based on scatterometry, a need arises for improved systems and methods for determination of overlay based on scatterometry that overcome some, or all, of the limitations identified above.

SUMMARY

A metrology system for measuring an overlay error of a sample is disclosed, in accordance with one or more embodiments of the present disclosure. In one embodiment, the metrology system includes a broadband illumination source emitting broadband illumination. In another embodiment, the metrology system includes optical elements configured to direct the broadband illumination towards a target on the sample and collect illumination reflected or diffracted from the target and direct it to a spectrometer. In another embodiment, the spectrometer is configured to disperse multiple wavelengths of the illumination collected from the sample to multiple elements of a sensor to generate a plurality of signals. In another embodiment, the metrology system includes a controller configured to calculate an overlay error between a first structure and a second structure of the target by comparing the plurality of signals with a plurality of calculated signals.

A method for determining an overlay error in a sample is disclosed, in accordance with one or more embodiments of the present disclosure. In one embodiment, the method includes providing a sample with a plurality of periodic targets each having a first structure in a first layer and a second structure in a second layer, wherein there is at least one predefined offset between the first and second structures. In another embodiment, the method includes directing and focusing radiation onto the sample. In another embodiment, the method includes receiving radiation from the sample. In another embodiment, the method includes directing the received radiation to a spectrometer, wherein the spectrometer disperses the received radiation into a plurality of wavelengths that are directed to a sensor comprising a plurality of sensor elements that generate a plurality of signals corresponding to the plurality of wavelengths of the received radiation. In another embodiment, the method includes calculating an overlay error between the first structure and the second structure by comparing the plurality of signals with a plurality of calculated signals.

A metrology system for measuring an overlay error of a sample is disclosed, in accordance with one or more embodiments of the present disclosure. In one embodiment, the metrology system includes a broadband illumination source and an objective lens configured to focus illumination on the sample and collect illumination reflected, diffracted, or scattered from the sample. In another embodiment, the method includes one or more illumination optical elements configured to direct illumination from the broadband illumination source to the objective lens. In another embodiment, the method includes one or more collection optical elements configured to direct said reflected, diffracted, or scattered illumination to a detector assembly. In another embodiment, the objective lens has a numerical aperture of approximately 0.9 or higher, and the objective lens is configured to operate over a wavelength range from less than approximately 400 nm to longer than approximately 800 nm. In another embodiment, the one or more illumination optical elements comprise a first tube lens comprising one or more optical elements configured to form a first intermediate image within the first tube lens such that a chief ray of the broadband illumination and a marginal ray of the broadband illumination do not intersect within the first tube lens. In another embodiment, the one or more collection optical elements comprise a second tube lens comprising one or more optical elements configured to form a second intermediate image within the first tube lens such that the chief ray of the broadband illumination and the marginal ray of the broadband illumination do not intersect within the second tube lens.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures.

DETAILED DESCRIPTION

Figure 1:
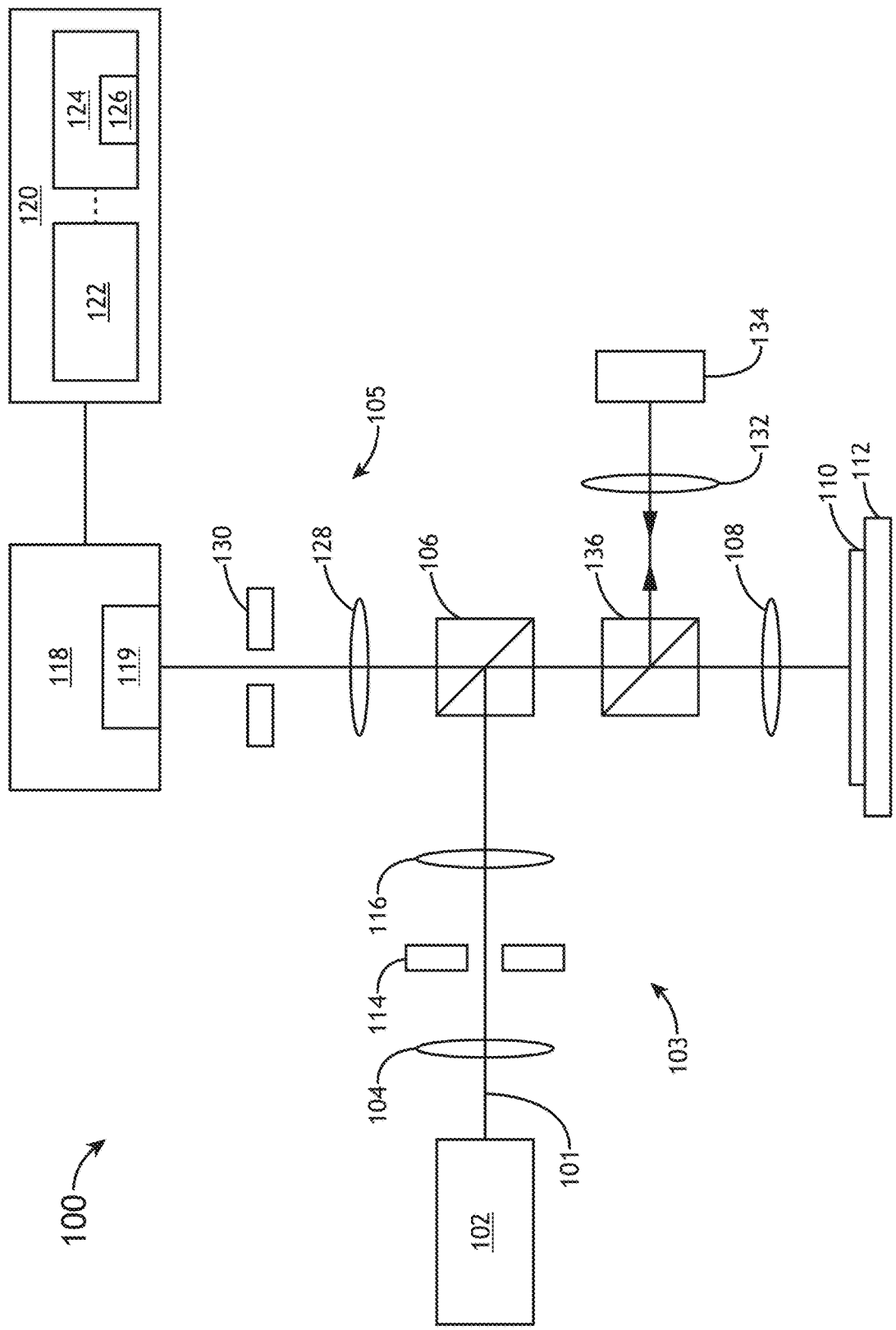
FIG. 1 illustrates a block diagram view of an inspection or metrology system, in accordance with one or more embodiments of the present disclosure.

Reference will now be made in detail to the subject matter disclosed, which is illustrated in the accompanying drawings.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

Referring generally to FIGS. 1-6, systems and methods for improved overlay metrology are described, in accordance with one or more embodiments of the present disclosure.

One or more embodiments of the present disclosure are directed to an overlay metrology system configured for accurate determination of overlay between layers of a semiconductor stack based on scatterometry by using spectroscopic reflectometer-based hardware architecture in conjunction with a model-based overlay metrology (mOVL) algorithm architecture.

Semiconductor metrology tools are most useful if they can measure on all, or most, of the different materials and structures used in complementary metal-oxide semiconductor (CMOS) manufacturing. It is noted that different materials and structures used in CMOS manufacturing exhibit drastically different reflectivities from one another. In this regard, in order to provide increased flexibility, semiconductor metrology tools may use multiple wavelengths (e.g., broadband radiation/illumination) and/or multiple angles of light illumination and light collection. For the purposes of the present disclosure, the terms "light," "radiation," and "illumination" may be used interchangeably, unless noted otherwise herein.

Spectroscopic reflectometry utilizes multiple wavelengths or colors of light to obtain data to analyze parameters such as film thickness and overlay. Reflectometry is the measurement of reflected light. For overlay metrology, a wavelength spectrum in the visible region is typically used. Light reflected from the substrate and film surface is analyzed using computers and algorithms. The analysis yields the parameters of interest without destroying or contacting the film. Spectroscopic scatterometry is designed to measure the diffraction response at a fixed angle of incidence (for instance, at normal incidence) using multiple wavelengths. This mechanism makes use of thin-film metrology equipment, such as spectroscopic ellipsometers and spectroscopic reflectometer systems, to accurately extract topographic profile information from periodic structures.

Additional embodiments of the present disclosure are directed to a scatterometry system based on spectroscopic reflectometry which may illuminate multiple cells of a target structure one at a time. A small field stop may limit the illumination to a single cell in order to prevent signal contamination between adjacent cells. An aperture stop may limit the illumination to a sufficiently small numerical aperture (NA) to prevent overlap between the diffracted orders used as the metrology signal and other diffracted orders. Furthermore, the optical elements transmitting the signal from the wafer (e.g., sample) to the spectrometer are designed such that only illumination with the selected diffracted orders (e.g., the metrology signal) may pass to the spectrometer. The spectrometer may then analyze the received signal either in an imaging mode or in a non-imaging mode.

It is noted herein that measurement of parameters of interest usually involves a number of algorithms. As scatterometry-based metrology involves solving an inverse scattering problem in nature, a system identification algorithm, such as neural networks or nonlinear regression, is needed to extract the parameters of interest from the scattering signals. In addition, to theoretically predict the scattering properties of structures, an electro-magnetic (EM) solver is needed to model the optical interaction of the incident beam with the sample. Potential algorithms which may be used include, but are not limited to, rigorous coupled wave analysis (RCWA), finite element method (FEM), method of moments (MoM), surface integral method, volume integral method, finite difference time domain (FDTD), and the like. In one embodiment, aspects of the present disclosure utilize model-based overlay metrology (mOVL) as the algorithm architecture. It is noted herein that mOVL borrows ideas from optical critical dimension (OCD) metrology, in which critical dimensions (CD) are deduced accurately from either broadband spectrum or angular scattering information.

It is further noted herein that the implementation of scatterometry for CD and profile measurements is based on the ability to model the signal formation process. The signal contains sufficient information such that the measurement can be made by finding those parameters that fit the closest between modeled and experimental signatures. The same method can be applied to overlay measurements, reducing the number of measurement cells needed, and providing both overlay and profile data.

It is noted that mOVL may resolve overlay inaccuracy issues. For example, mOVL may remove error of the sine overlay model, and avoid the need to add additional targets. It is further noted that mOVL may achieve accurate overlay measurements regardless of process variations and target asymmetries. In addition, mOVL can provide lithography/process information other than overlay information. For example, the variation of resist profile over the wafer can be identified. Furthermore, mOVL can simplify target model setup. For example, it can accurately estimate nominal CD values, optimize sensitivity, and reduce parameter correlation.

Additional embodiments of the present disclosure are directed to an overlay metrology system comprising a broadband illumination source configured to emit broadband illumination (such as light comprising multiple wavelengths over a wavelength range of approximately 400 nm-800 nm or wider), a high (>0.9) numerical aperture (NA) objective lens configured to focus light onto a sample and collect illumination reflected or diffracted from the sample, illumination optics configured to deliver illumination from the broadband illumination source to the objective lens, and collection optics configured to direct the collected illumination from the objective lens to a detector. The illumination optics may include a first tube lens configured to create a first externally accessible pupil, wherein the first tube lens forms a first intermediate image within the first tube lens such that a chief ray of the broadband illumination and a marginal ray of the broadband illumination do not intersect within the first tube lens. The collection optics may include a second tube lens configured to create a second externally accessible pupil, wherein the second tube lens forms a second intermediate image within the second tube lens such that a chief ray of the broadband light and a marginal ray of the broadband light do not intersect within the second tube lens. Either, or both, tube lenses may be further configured to correct axial chromatic variations of the objective lens that would, if not corrected, result in the axial locations of said first and second relayed pupils varying with wavelength. In one embodiment, adjustable or switchable apertures are placed at the locations of both relayed pupils to enable overlay metrology to be performed with structured illumination and/or in dark-field modes. The detector may include a spectrometer or a camera. It is noted herein that the terms chief ray and marginal ray are commonly used in optics and are well understood by those skilled in the art.

FIG. 1 illustrates a block diagram view of an inspection or metrology system 100, in accordance with one or more embodiments of the present disclosure. In one embodiment, system 100 includes an illumination source 102, an illumination arm 103, a collection arm 105, and a detector assembly 118. In one embodiment, the illumination arm 103 may include one or more illumination optical elements configured to direct illumination 101 from the illumination source 102 to the sample 110. Similarly, in another embodiment, collection arm 105 may include one or more collection optical elements configured to direct illumination reflected, refracted, scattered, or the like, from the surface of the sample 110 to one or more sensors 119 of the detector assembly 118. A discussion of metrology systems is provided in U.S. Pat. No. 9,080,971, entitled "METROLOGY SYSTEMS AND METHODS," to Kandel et al., and U.S. Pat. No. 7,474,461, entitled "BROAD BAND OBJECTIVE HAVING IMPROVED LATERAL COLOR PERFORMANCE," to Chuang et al., both of which are incorporated herein by reference in the entirety.

In one embodiment, system 100 is configured to inspect or measure a sample 110. Sample 110 may include any sample known in the art including, but not limited to, a wafer, a semiconductor wafer, a reticle, a photomask, and the like. In another embodiment, sample 110 is disposed on a stage assembly 112 to facilitate the movement of sample 110. Stage assembly 112 may include any stage assembly known in the art including, but not limited to, an X-Y stage or an R-θ stage. In one embodiment, stage assembly 112 is capable of adjusting the height of sample 110 during inspection to maintain focus on the sample 110. In an additional and/or alternative embodiment, one or more optical elements of the illumination arm 103 may be adjusted to maintain focus on sample 110.

Illumination source 102 of system 100 may include any illumination source known in the art. For example, illumination source 102 may include, but is not limited to, one or more lasers and/or a broadband light source. By way of another example, illumination source 102 may include a continuous source, such as an arc lamp, a laser-pumped plasma light source, or a continuous wave (CW) laser. By way of yet another example, illumination source 102 may be a pulsed source, such as a mode-locked laser, a Q-switched laser, or a plasma light source pumped by a mode-locked or Q-switched laser. Suitable light sources that may be included in illumination source 102 are described in U.S. Pat. No. 7,705,331, entitled "Methods and systems for providing illumination of a specimen for a process performed on the specimen," to Kirk et al., U.S. Pat. No. 9,723,703, entitled "System and method for transverse pumping of laser-sustained plasma," to Bezel et al., and U.S. Pat. No. 9,865,447, entitled "High brightness laser-sustained plasma broadband source", to Chuang et al. These patents are incorporated herein by reference in the entirety.

In another embodiment, illumination source 102 may be configured to emit any type of illumination 101 known in the art including, but not limited to, near IR (NIR), visible, near UV, deep UV (DUV) and/or vacuum UV (VUV) radiation.

Illumination source 102 may be configured in any orientation known in the art in order to illuminate the sample 110 from one or more illumination paths, including one or more angles of incidence and/or one or more azimuth angles. For example, illumination source 102 may be configured in a dark-field orientation, a bright-field orientation, and the like. Additionally, illumination source 102 may be configured to illuminate the sample 110 with illumination 101 with one or more wavelengths and/or polarization states. Furthermore, system 100 may additionally include a fast feedback to illumination source 102 for correcting and/or stabilizing one or more characteristics of the illumination source 102 including, but not limited to, power, brightness, spectrum, and the like. It is noted that illumination 101 emitted from illumination source 102 may be delivered by any means known in the art including, but not limited to, free-space propagation, optical fiber, light guide, and the like. In one embodiment, illumination source 102 of system 100 is configured to illuminate a line on sample 110.

In another embodiment, system 100 includes an illumination arm 103 configured to direct illumination 101 from illumination source 102 to sample 110. Illumination arm 103 may include any number and type of illumination optical elements known in the art. For example, illumination arm 103 may include collimating optics 104, an illumination pupil aperture 114, an illumination tube lens 116, beam splitters 106, 136, and objective lens 108. In one embodiment, illumination tube lens 116 is configured to image illumination pupil aperture 114 to a pupil stop within objective lens 108 (i.e. illumination tube lens 116 is configured such that the illumination pupil aperture 114 and the pupil stop are conjugate to one another). Illumination pupil aperture 114 may be configurable, for example, by switching different apertures into the location of illumination pupil aperture 114, or by adjusting a diameter or shape of the opening of illumination pupil aperture 114. In this regard, sample 110 may be illuminated by different ranges of angles depending on the measurement or inspection being performed.

In another embodiment, system 100 includes a collection arm 105 configured to direct illumination reflected, refracted, or scattered from sample 110 to one or more sensors 119 of a detector assembly 118. Collection arm 105 may direct and/or focus the reflected and/or scattered illumination in one or more dark-field and/or bright-field collection channels to the one or more sensors 119 of the detector assembly 118. In this regard, system 100 may include one or more collection paths that collect illumination reflected, refracted, or scattered by the sample 110 in different directions and/or are sensitive to different wavelengths and/or to different polarization states.

In one embodiment, the one or more collection optical elements of collection arm 105 include objective lens 108, a collection tube lens 128, and a collection pupil aperture 130. Collection tube lens 128 may be configured to image the pupil stop within objective lens 108 to collection pupil aperture 130 (i.e. collection tube lens 128 may be configured such that the collection pupil aperture 130 and the pupil stop within objective lens 108 are conjugate to one another). Collection pupil aperture 130 may be configurable, for example, by switching different apertures into the location of collection pupil aperture 130, or by adjusting a diameter or shape of the opening of collection pupil aperture 130. In this way, different ranges of angles of illumination reflected or scattered from sample 110 may be directed to detector assembly 118.

It is noted herein that illumination pupil aperture 114 and/or the collection pupil aperture 130 may comprise a programmable aperture such as one described in U.S. Pat. No. 9,255,887 entitled "2D programmable aperture mechanism" to Brunner, or to one described in U.S. Pat. No. 9,645,287 entitled "Flexible optical aperture mechanisms" to Brunner. Methods of selecting an aperture configuration for wafer inspection are described in U.S. Pat. No. 9,709,510 "Determining a configuration for an optical element positioned in a collection aperture during wafer inspection" to Kolchin et al., and U.S. Pat. No. 9,726,617 "Apparatus and methods for finding a best aperture and mode to enhance defect detection" to Kolchin et al. All the above-referenced patents are incorporated herein by reference in the entirety.

In another embodiment, one or both of illumination tube lens 116 and collection tube lens 128 are further configured to substantially cancel axial pupil chromatic aberrations of objective lens 108. Additional details of tube lens designs are described herein, particularly in reference to FIG. 5 and its associated description.

In one embodiment, illumination arm 103 and/or collection arm 105 include a Linnik interferometer comprising a reference objective lens 132 and a reference mirror 134. Reference objective lens 132 may be an objective lens of a similar design to objective lens 108, or it may include a simpler design (for example it may have a smaller field of view) to reduce cost. It is noted herein that a Linnik interferometer may be used to ensure that a layer of interest on the surface of sample 110 is in focus by adjusting the height of stage assembly 112 relative to objective lens 108 while detector assembly 118 monitors an optical signal created by interference of a reflection from the sample 110 with a reflection from reference mirror 134. In one embodiment, a shutter (not shown) may be included to block illumination in the illumination path of the reference objective lens 132 and reference mirror 134 to allow measurement or inspection of sample 110 without interference with the illumination reflected from the reference mirror 134. In an alternative embodiment, the reference objective lens 132 and reference mirror 134 may be omitted from system 100 and an autofocus system may be included in inspection or metrology system 100.

Additional details of various embodiments of inspection or metrology system 100 are described in U.S. Pat. No. 9,891,177, entitled "TDI Sensor in a Darkfield System," to Vazhaeparambil et al., U.S. Pat. No. 9,279,774, entitled "Wafer inspection," to Romanovsky et al., U.S. Pat. No. 7,957,066, entitled "Split field inspection system using small catadioptric objectives," to Armstrong et al., U.S. Pat. No. 7,817,260, entitled "Beam delivery system for laser darkfield illumination in a catadioptric optical system," to Chuang et al., U.S. Pat. No. 5,999,310, entitled "Ultrabroadband UV microscope imaging system with wide range zoom capability, to Shafer et al., U.S. Pat. No. 7,525,649, entitled "Surface inspection system using laser line illumination with two dimensional imaging," to Leong et al., U.S. Pat. No. 9,080,971, entitled "Metrology systems and methods," to Kandel et al., U.S. Pat. No. 7,474,461, entitled "Broad band objective having improved lateral color performance," to Chuang et al., U.S. Pat. No. 9,470,639, entitled "Optical metrology with reduced sensitivity to grating anomalies," to Zhuang et al., U.S. Pat. No. 9,228,943, entitled "Dynamically Adjustable Semiconductor Metrology System," to Wang et al., U.S. Pat. No. 5,608,526, entitled "Focused Beam Spectroscopic Ellipsometry Method and System," to Piwonka-Corle et al., issued on Mar. 4, 1997, and U.S. Pat. No. 6,297,880, entitled "Apparatus for Analysing Multi-Layer Thin Film Stacks on Semiconductors," to Rosencwaig et al., issued on Oct. 2, 2001. All of the above-referenced patents are incorporated herein by reference in the entirety.

In one embodiment, collection arm 105 is configured to direct illumination reflected, refracted, or scattered from sample 110 to one or more sensors 119 of a detector assembly 118. Detector assembly 118 may include any detector assembly known in the art. For example, in embodiments where the illumination source 102 is configured to illuminate a line on sample 110, detector assembly 118 may include a line sensor or an electron-bombarded line sensor. Detector assembly 118 may be configured to detect a measured signal from sample 110 in response to the incident beam(s) of illumination 101 on the sample 110. In this regard, the measured signal from the detector assembly 118 (e.g., from the one or more sensors 119 of detector assembly 118) may comprise a plurality of spectral signals.

In another embodiment, detector assembly 118 is communicatively coupled to a controller 120 including one or more processors 122 and memory 124. In another embodiment, one or more processors 122 may be communicatively coupled to memory 124, wherein the one or more processors 122 are configured to execute a set of program instructions 126 stored on memory 124. In one embodiment, the one or more processors 122 may be configured to analyze the output of detector assembly 118. In one embodiment, the set of program instructions 126 are configured to cause the one or more processors 122 to analyze one or more characteristics of sample 110. In another embodiment, the set of program instructions 126 are configured to cause the one or more processors 122 to modify one or more characteristics of system 100 in order to maintain focus on the sample 110 and/or the detector assembly 118. For example, the one or more processors 122 may be configured to adjust the objective lens 108 or one or more optical elements of system 100 in order to focus illumination 101 from illumination source 102 onto the surface of the sample 110. By way of another example, the one or more processors 122 may be configured to adjust the objective lens 108 and/or one or more optical elements in order to collect illumination scattered and/or reflected off the surface of the sample 110 and focus the collected illumination on the detector assembly 118.

It is noted herein that any of the analysis steps previously described as being carried out by any of the subsystems of system 100 (e.g., detector assembly 118) may additionally and/or alternatively be carried out by the one or more processors 122 of controller 120. In another embodiment, system 100 may include a user interface (not shown). In another embodiment, the user interface may include a display.

It is noted herein that the elements of system 100 are provided merely for illustrative purposes, and that fewer/additional elements may be present in system 100 without departing from the spirit or scope of the present disclosure. In this regard, it is noted that system 100 may include additional optical elements including, but not limited to, one or more mirrors, one or more lenses, one or more polarizers, one or more collimators, one or more wave plates, one or more sensors, one or more additional detectors, one or more cameras, one or more apertures, and the like.

Figure 2:
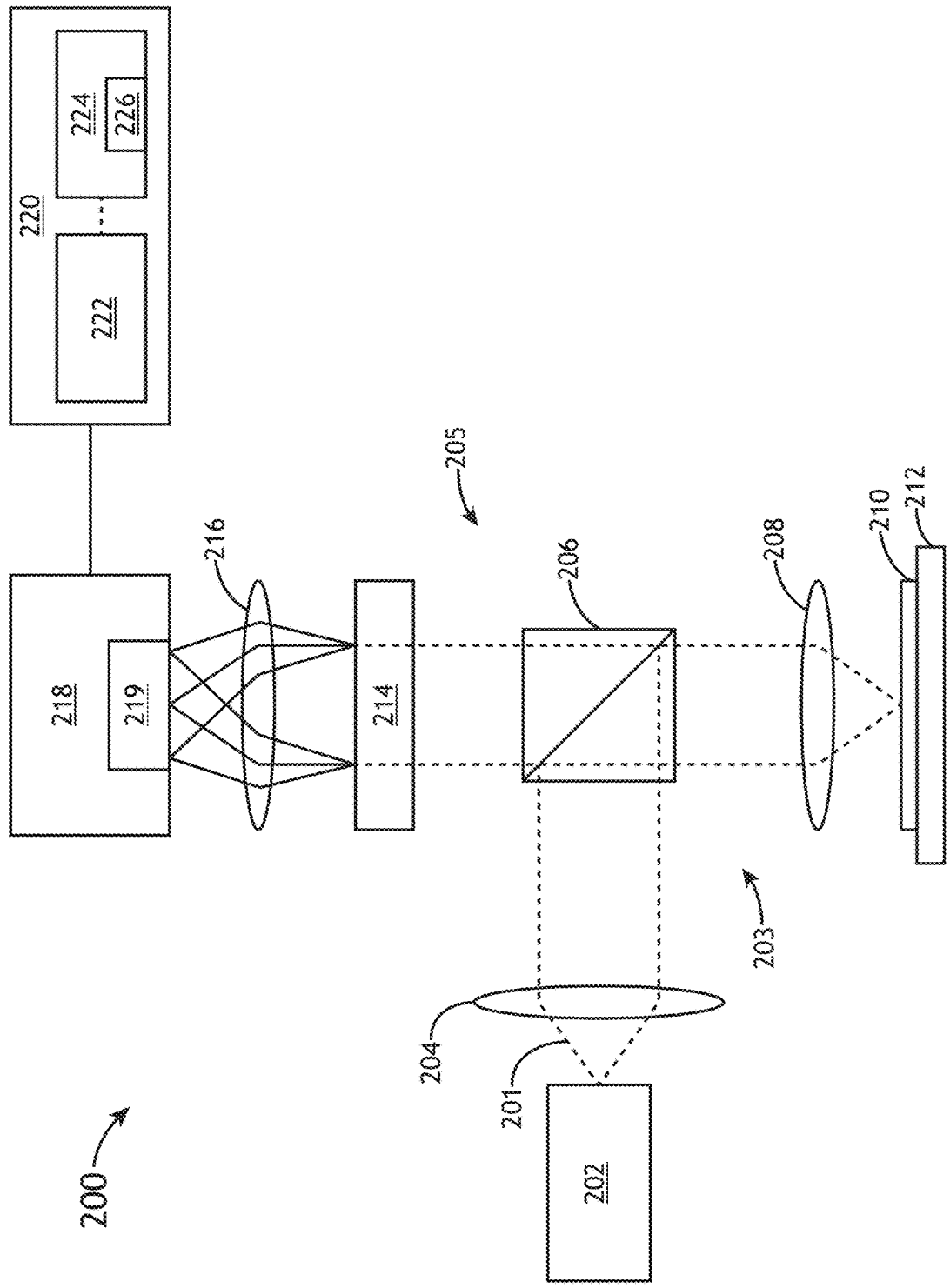
FIG. 2 illustrates a block diagram view of a scatterometry system based on a spectroscopic reflectometer, in accordance with one or more embodiments of the present disclosure.

FIG. 2 illustrates a block diagram view of a scatterometry system 200 based on spectroscopic reflectometer, according to one or more embodiments of the present disclosure. In one embodiment, system 200 includes an illumination source 202, an illumination arm 203, a collection arm 205, a spectrometer 214, and a detector assembly 218. It is noted herein that the description associated with system 100 of FIG. 1 may be regarded as applying to system 200 of FIG. 2, unless noted otherwise herein.

In one embodiment, system 200 may be configured to determine an overlay error between at least two layers in a multiple layer structure on a sample 210. Sample 210 may include any sample known in the art including, but not limited to, a wafer, a semiconductor wafer, a photomask, and the like. It is noted herein that the at least two layers in sample 210 typically include stacked periodic structures (e.g., grating structures). In this regard, it is further noted herein that sample 210 may include a plurality of periodic target structures (e.g., grating structures) disposed on the layers of sample 210, each periodic target structure having a first structure in a first layer and a second structure in a second layer. In another embodiment, the sample 210 may include predefined offsets between the first structure and the second structure.

Spectroscopic reflectometry utilizes multiple wavelengths or colors of light to obtain data to analyze parameters such as film thickness and overlay. Reflectometry is the measurement of reflected light. For overlay metrology, a wavelength spectrum in the visible region is typically used because visible light transmits through many of the materials commonly used in the semiconductor industry. Light reflected from the film surfaces and the substrate is analyzed using computers and algorithms. The analysis yields the parameters of interest without destroying or contacting the film. Spectroscopic scatterometry is designed to measure the diffraction response at a fixed angle of incidence (for instance, at normal incidence) using multiple wavelengths. This mechanism makes use of thin-film metrology equipment, such as spectroscopic ellipsometers and spectroscopic reflectometer systems, to accurately extract topographic profile information from periodic structures.

In one embodiment, system 200 includes an illumination source 202 for generating an optical incident beam (e.g., illumination 201) having multiple wavelengths, collimating optics 204 to collimate the illumination 201, a beam splitter 106, an objective lens 208 to direct illumination to the sample 210 and collect reflected and diffracted illumination from the sample 210, spectrometer 214, and detector assembly 218 including one or more sensors 219 for sensing a measured signal from the sample 210 in response to the incident beam (e.g., illumination 201).

Illumination source 202 of system 200 may include any illumination source known in the art. For example, illumination source 202 may include a broadband illumination source for generating illumination 201 having multiple wavelengths. For instance, illumination source 202 may include, but is not limited to, a white light source, an arc lamp, an electrode-less lamp, a laser sustained plasma (LSP) source, a supercontinuum source (e.g., broadband laser source), and the like. Examples of LSP sources include, but are not limited to, LSP sources from Energetiq Technology, Inc. Examples of supercontinuum sources include, but are not limited to, supercontinuum sources from NKT Photonics Inc. The illumination source 202 may also be configured to provide illumination 201 having sufficient brightness. For example, illumination source 202 may be configured to emit illumination 201 with a brightness greater than approximately 1 W/(nm cm$^2$ sr).

It may be appreciated that semiconductor metrology tools are most useful if they can measure on all, or most, of the different materials and structures used in CMOS manufacturing. Different materials and structures have very different reflectivities from one another. In order to have the flexibility, semiconductor metrology tools may use multiple wavelengths and/or multiple angles of light illumination and light collection. In this regard, it is noted herein that illumination source 202 may be configured in any orientation known in the art including, but not limited to, a dark-field orientation, a bright-field orientation, and the like. Furthermore, system 200 may additionally include a fast feedback to illumination source 202 for correcting and/or stabilizing one or more characteristics of the illumination source 202 including, but not limited to, power, brightness, spectrum, and the like. It is noted that illumination 201 emitted from illumination source 202 may be delivered by any means known in the art including, but not limited to, free-space propagation, optical fiber, light guide, and the like.

In another embodiment, system 200 includes an illumination arm 203 configured to direct illumination 201 to the sample 210. The illumination arm 203 may include any number and type of illumination optical components known in the art. In one embodiment, illumination arm 203 includes collimating optics 204 to collimate the illumination 201, a beam splitter 206, and an objective lens 208 to direct illumination 201 to the sample 210.

In another embodiment, system 200 includes a collection arm 205 configured to collect illumination (e.g., radiation, light) reflected, diffracted, or scattered from the sample 210. In another embodiment, collection arm 205 may direct and/or focus the reflected and/or scattered illumination to a spectrometer 214. It is noted herein that the spectrometer 214 may include a dispersive element 216 configured to separate the collected illumination into a plurality of wavelengths, and direct the collected illumination to a plurality of sensors 219 of a detector assembly 218. In this regard, the detector assembly 218 may be configured to detect a measured signal from the sample 210 in response to the incident beam(s) of illumination 201 on the sample 210. In this regard, the measured signal from the detector assembly 218 (e.g., from the sensors 219 of detector assembly 218) may comprise a plurality of spectral signals.

In another embodiment, detector assembly 218 is communicatively coupled to a controller 220 including one or more processors 222 and memory 224. In another embodiment, one or more processors 222 may be communicatively coupled to memory 224, wherein the one or more processors 222 are configured to execute a set of program instructions stored on memory 224. In one embodiment, the one or more processors 222 may be configured to analyze the output of detector assembly 218. In one embodiment, the set of program instructions are configured to cause the one or more processors 222 to analyze one or more characteristics of sample 210. In another embodiment, the set of program instructions are configured to cause the one or more processors 222 to modify one or more characteristics of system 200 in order to maintain focus on the sample 210, the spectrometer 214, and/or the detector assembly 218. For example, the one or more processors 222 may be configured to adjust the objective lens 208 or one or more optical elements of system 200 in order to focus illumination 201 from illumination source 202 onto the surface of the sample 210. By way of another example, the one or more processors 222 may be configured to adjust the objective lens 208 and/or one or more optical elements in order to collect illumination scattered and/or reflected off the surface of the sample 210 and focus the collected illumination on spectrometer 214 and/or detector assembly 218.

It is noted herein that any of the analysis steps previously described as being carried out by any of the subsystems of system 200 (e.g., spectrometer 214, sensors 219, detector assembly 218) may additionally and/or alternatively be carried out by the one or more processors 222 of controller 220. In another embodiment, system 200 may include a user interface (not shown). In another embodiment, user interface may include a display.

It is noted herein that the elements of system 200 are provided merely for illustrative purposes, and that fewer/additional elements may be present in system 200 without departing from the spirit or scope of the present disclosure. In this regard, it is noted that system 200 may include additional optical elements including, but not limited to, one or more mirrors, one or more lenses, one or more polarizers, one or more collimators, one or more wave plates, one or more sensors, one or more additional detectors, one or more cameras, one or more apertures, and the like.

In one embodiment, the illumination source 202 of scatterometry system 200 may be configured to illuminate a single cell of a target structure on sample 210 at a time. In this regard, a field stop (not shown) may be placed in the illumination path (e.g., illumination arm 203) to limit the illumination 201 to a single cell in order to prevent signal contamination between adjacent cells. Furthermore, an illumination aperture stop (not shown) may be used to limit the illumination 201 to a sufficiently small numerical aperture (NA) to prevent overlap between the diffracted order used as the metrology signal and other diffracted orders. In an additional and/or alternative embodiment, illumination source 202 of system 200 may be configured to illuminate multiple cells of a target structure on a sample 210 one at a time.

In another embodiment, the illumination source 202 may be configured to illuminate multiple cells of a target structure with illumination 201 which is linearly polarized. In one embodiment, illumination arm 203 is configured to direct illumination 201 from the illumination source 202 onto the sample 210 such that the illumination 201 is incident substantially perpendicular to the sample 210 surface. In this regard, the zeroth order diffracted radiation is measured as a function of wavelength. It is noted herein that, at normal incidence, multiple reflectance spectra may be obtained for multiple polarization angles with respect to the grating structures disposed on the layers of sample 210. In one embodiment, elements of the collection arm 205 (e.g., objective lens 208, beam splitter 206, and the like) which collect illumination scattered from the sample 210 are configured such that the collection arm 205 only transmits metrology illumination to the spectrometer 214.

In another embodiment, the scattered illumination is analyzed by spectrometer 214 either in an imaging mode or in a non-imaging mode. Typical data collection includes both transverse electric (TE) and transverse magnetic (TM) spectra. In this regard, it is noted that using polarized light allows for enhanced sensitivity as both the amplitude and the phase differences between the TE and TM spectra may be measured.

Figure 3:
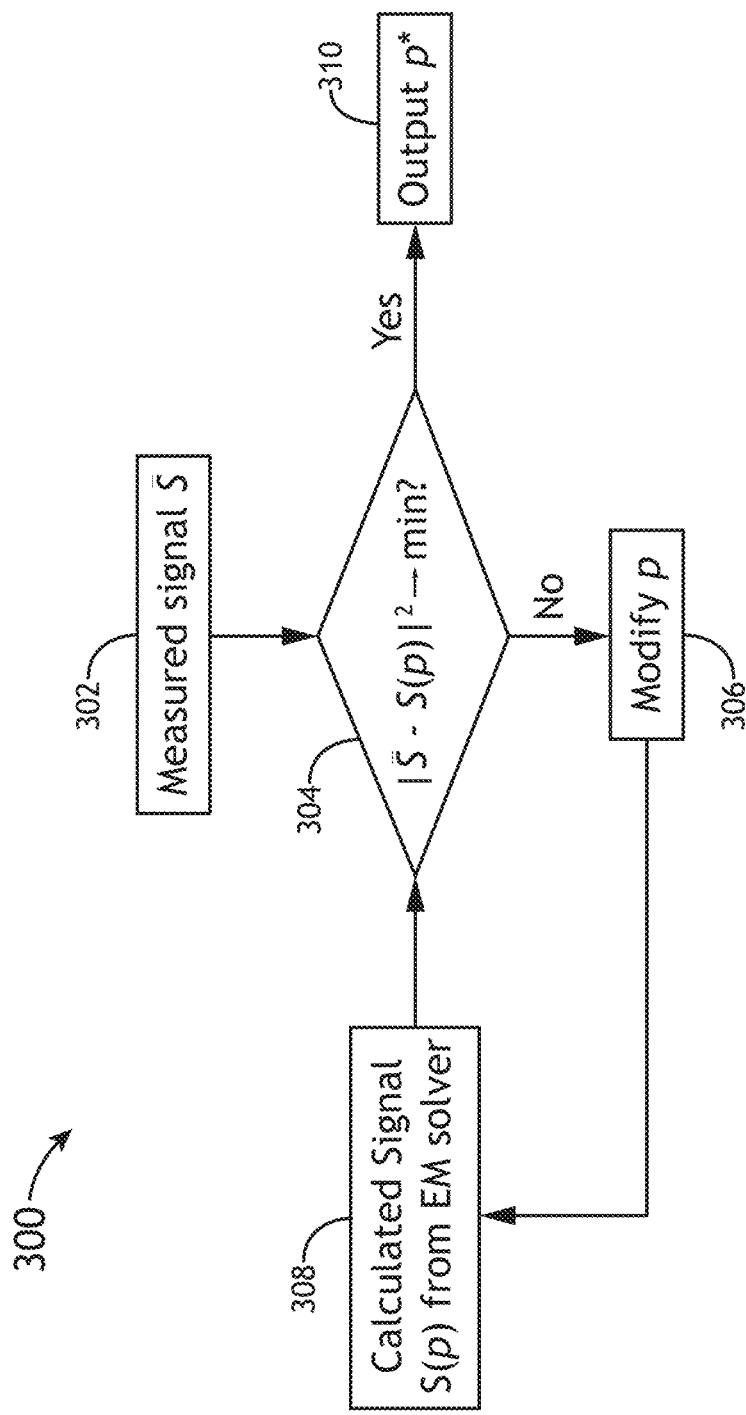
FIG. 3 illustrates a process flow diagram depicting a real-time-regression-based algorithm for model-based overlay metrology used in a scatterometry system, in accordance with one or more embodiments of the present disclosure.
Figure 4:
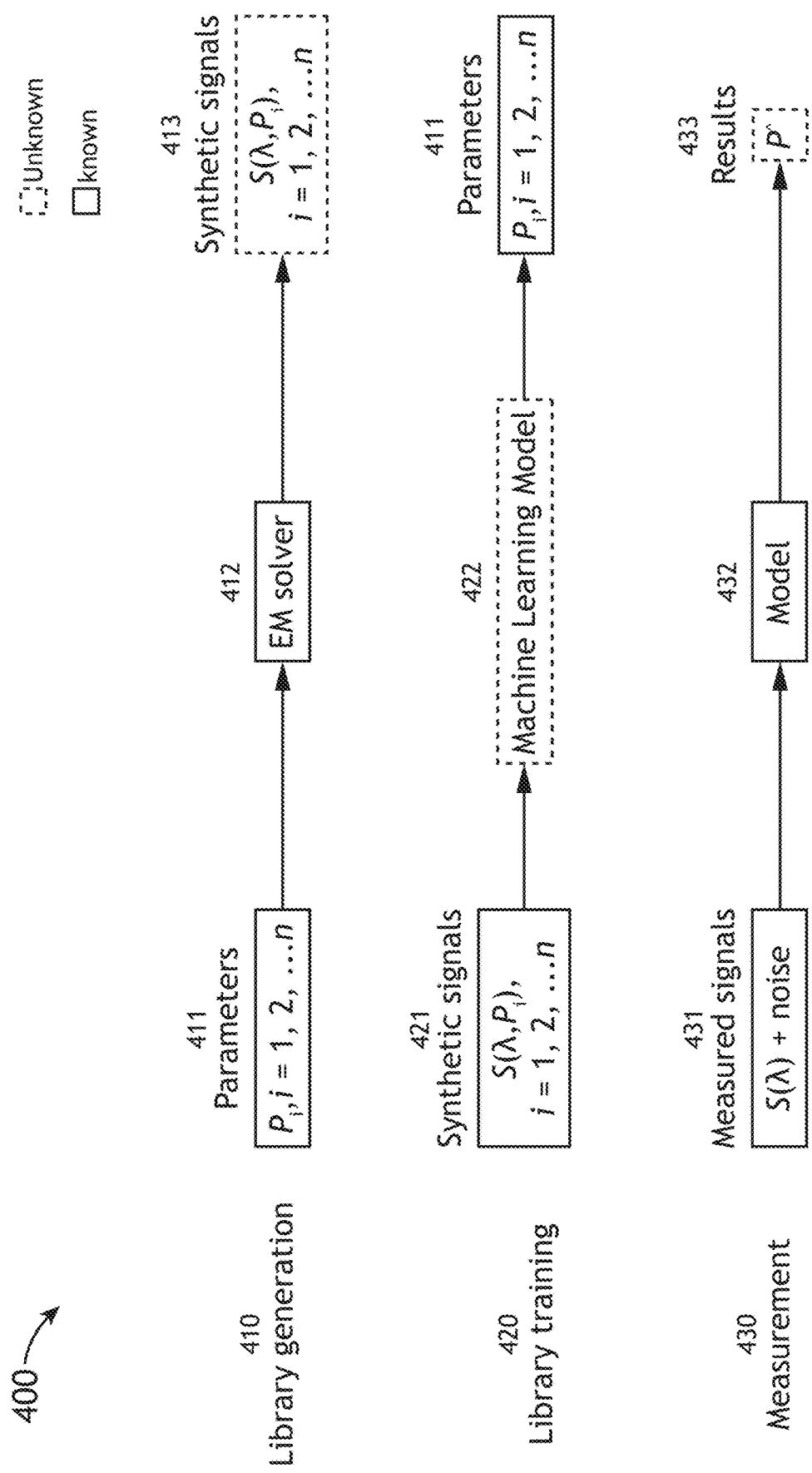
FIG. 4 illustrates a conceptual view of a library technology-based algorithm for model-based overlay metrology used in a scatterometry system, in accordance with one or more embodiments of the present disclosure.

FIGS. 3 and 4 illustrate algorithms 300, 400 for model-based overlay metrology (mOVL), in accordance with one or more embodiments of the present disclosure. It is noted herein that algorithms 300, 400 may be used in conjunction with system 100 and scatterometry system 200. It is further recognized, however, that algorithms 300, 400 are not limited to system 100 and scatterometry system 200, in that additional or alternative system-level embodiments may carry out all or part of the steps of algorithms 300, 400.

In one embodiment, the role of algorithms 300, 400 is to extract the value of the overlay from the measured signals (e.g., signals measured in response to collected illumination on detector assembly 218). As such, it is noted that the nature of algorithms 300, 400 depends on the properties of the signals, and hence on the specific technology (e.g., hardware, software) used.

In a scatterometry system (e.g., scatterometry system 200), the intensities of the radiation reflected from the targets into specific well-defined diffraction orders are measured as a function of a continuous parameter. In spectroscopic scatterometry, this continuous parameter is the wavelength of the reflected radiation, while in angle-resolved scatterometry it is the polar and azimuth angles at which light is diffracted from the target. Due to the lack of spatial resolution, a scatterometry tool may measure the various cells of the target sequentially. In this regard, signals of each cell may be measured by focusing a small spot onto the cell and reading the intensities either with a spectrometer in an image plane (e.g., spectroscopic scatterometry) or with a CCD or other image sensor in a pupil plane (e.g., angle-resolved scatterometry). Thus, scatterometry signals represent intensities as a function of the relevant continuous parameter measured separately for each cell of the target.

An overlay metrology target is a proxy target structure disposed on one or more layers of a sample 210. Overlay metrology targets enable an apparatus/system to determine the overlay error between at least two exposures of the targets. In principle, a determination of overlay error of an overlay metrology target may include information from multiple exposures. It is convenient to classify overlay metrology targets as either side-by-side or grating-over-grating structures. In both cases the metrology target comprises a plurality of cells. In the case of a side-by-side target, an individual cell typically contains information from a single exposure, while in the case of a grating-over-grating target, the information from the two exposures overlaps in a single cell. As a general rule, side-by-side target designs are compatible with imaging sensors, while grating-over-grating designs are compatible with scatterometry sensors, although there may be exceptions.

Scatterometry measurements are usually performed on specially designed targets with a shift which is designed to be approximately 25% to 35% of the pitch to ensure maximum overlay sensitivity. In the case of normal incident polarized reflectometer, the TE spectrum is typically more sensitive to overlay than the TM spectrum. Therefore, in order to reduce the measurement time without affecting sensitivity, only TE spectra are usually analyzed.

It is noted herein that the overlay between overlay targets is usually extracted from the signals (e.g., signals generated in response to collected radiation on detector assembly 218) by a differential signal approach. It is further noted that the algorithms and target design differ substantially depending on whether zeroth or first order scatterometry is employed. For zeroth order scatterometry, each cell gives a single zeroth order signal as a function of the continuous parameter, while for first order scatterometry (e.g., +first and −first orders), two signals are measured as a function the continuous parameter for each cell. In this regard, fewer cells are required for first order scatterometry, leading to a potentially smaller target. However, first order scatterometry may be cost-prohibitive in some instances, as first order scatterometry may require a high degree of pupil uniformity, requiring heightened quality of the calibration methodology which reduces the effect of pupil non-uniformity. In the non-ideal case, where residual pupil non-uniformity effects survive, there is a tradeoff between target size (in favor of first order scatterometry) and performance (in favor of zeroth order scatterometry).

It is recognized herein that mOVL may resolve overlay inaccuracy issues. For example, mOVL may remove the error of the sine overlay model while avoiding the need to add additional targets. This novel method can achieve accurate overlay measurements despite the existence of process variations and target asymmetries. In addition, mOVL may provide lithography/process information other than overlay information. For example, the variation of resist profile over the sample 210 may be identified using mOVL. Furthermore, mOVL may simplify target model setup. It may accurately estimate nominal CD values, optimize sensitivity, and reduce parameter correlation.

Two mOVL algorithm embodiments are described herein. Namely, the two mOVL algorithm embodiments include real-time regression and library technology. Reference will now be made in particular to FIG. 3.

FIG. 3 illustrates a process flow diagram depicting a real-time regression-based algorithm 300 for model-based overlay metrology (mOVL) used in a scatterometry system, in accordance with one or more embodiments of the present disclosure. As illustrated in FIG. 3, algorithm 300 solves a least-square problem as follows:

$$p^* = \operatorname*{argmin}_{p} \sum_j \left[\tilde{S}(\lambda_j) - S(p, \lambda_j)\right]^2 \quad (1)$$

where, p consists of the parameters to be identified, such as overlay (OVL), critical dimensions (CDs), heights (HTs), side wall angles (SWAs) of the gratings, the thicknesses (THs) of the films, and the like, $\lambda_j$, j=1, 2, ..., $n_\lambda$ are the discrete wavelength samples, $\tilde{S}(\lambda_j)$ is the measured signal at $\lambda_j$, $S(p, \lambda_j)$ is the signal from the target under p at $\lambda_j$ calculated via an electromagnetic field (EM) solver (e.g., Rigorous Coupled-Wave Analysis (RCWA)), and p* is the measured value of p.

In step 302, signal $\tilde{S}$ is measured. It is noted herein that signals S and $\tilde{S}$ can be chosen as the zeroth order reflectance or the difference between the reflectance from two targets with different preset offsets considering the sensitivity and noise level of the system.

In step 304, measured signal $\tilde{S}$ is input into Equation 1. As noted previously herein, Equation 1 of step 304 includes solving a least-square problem in order to find a value for p* such that p* is minimized. In step 304, if the value of p* is not minimized, algorithm 300 proceeds to step 306.

In step 306, p is modified. Algorithm 300 then proceeds to step 308.

In step 308, S(p) is calculated. As noted previously herein, S(p) may be calculated using a high-efficiency EM solver. In this regard, algorithm 300 solves a least-square problem in which the optical response from the target under investigation is calculated in real time (or near-real time) from a high-efficiency EM solver. In another embodiment, a non-linear programming algorithm, such as the Levenberg-Marquardt method, may be used to solve this least-square problem.

Returning to step 304, if the value of p* is minimized, algorithm 300 proceeds to step 310, where p* is output.

It is noted herein that the real-time regression scheme depicted in FIG. 3 may be favored at the research and development stage, as it requires little time to set up the recipe. On the other hand, when the target under investigation is complex, the EM solver may require longer amounts of time to calculate the optical response, and a library technology approach, such as that depicted in FIG. 4, may be more appropriate.

FIG. 4 illustrates a conceptual view of a library technology-based algorithm 400 for model-based overlay metrology (mOVL) used in a scatterometry system, in accordance with one or more embodiments of the present disclosure.

Library technology typically encompasses library generation, library training, and measurement. By way of example, a library technology-based algorithm for mOVL may include: setting up an overlay model, computing the angle-resolved or spectral signal, generating the signal and the overlay library, and applying the library to measurement signals to determine overlay. In one embodiment, algorithm 400 utilizes library technology techniques including, but not limited to, library generation 410, library training 420, and measurement 430.

In one embodiment, library generation 410 includes generating samples of the parameters of interest 411 and using an electro-magnetic (EM) solver 412 in order to produce synthetic signals 413.

Measurement of parameters of interest (e.g., $p_i$) usually involves a number of algorithms. As scatterometry-based metrology is solving an inverse scattering problem in nature, a system identification algorithm such as neural networks or nonlinear regression is needed to extract the parameters of interest from the scattering signals. In addition, to theoretically predict the scattering properties of structures, an electro-magnetic (EM) solver is needed to model the optical interaction of the incident beam (e.g., illumination 201) with the sample 210. Examples of EM solvers may include, but are not limited to, Rigorous Coupled Wave Analysis (RCWA), Finite Element Method (FEM), Method of Moments (MoM), surface integral method, volume integral method, Finite Difference Time Domain (FDTD), and the like. As noted previously herein, the present disclosure uses model-based overlay metrology (mOVL) as the algorithm architecture. mOVL borrows ideas from optical critical dimension (OCD) metrology, in which critical dimensions (CD) are deduced accurately from either broadband spectrum or angular scattering information.

In one embodiment, as depicted in FIG. 4, samples of the parameters of interest (e.g., $p_i$) 411 are generated. For each combination of the parameters of interest 411, the signals reflected from the target (e.g., target on sample 210) with these parameters are calculated for all the wavelengths using an EM solver 412 to generate synthetic signals 413. EM solver 412 may include, but is not limited to, a Rigorous Coupled-Wave Analysis (RCWA). In one embodiment, this process can be described as $S(\lambda, p_i)=f(\lambda, p_i)$, where $f(\lambda, p_i)$ is governed by the physics of scatterometry and the propagation of the scattered light through the optics of the metrology system (e.g., system 200).

In another embodiment, algorithm 400 includes library training 420. In library training 420, a machine learning model 422, such as neural network, is used to relate the parameters 423 (from 411) to the synthetic signals 421 (from 413). This process can be described as $p=f^{-1}\circ S$, where $f^{-1}$ is obtained by calling a machine learning regression model using $S(\lambda, p_i)$ for all wavelengths and combinations of parameters as the input and $p_i$ for all combinations of parameters as output. It is noted herein that, considering the ill-conditioned nature of these inverse problems, appropriate regularization techniques may need to be introduced in order to ensure generalization capability of the trained model.

In another embodiment, algorithm 400 includes measurement 430. In one embodiment, measured signals 431 are first obtained from the metrology system (e.g., system 200). In this regard, it is noted that measured signals 431 may include system noise. In another embodiment, the measured signals 431 are then fed into the machine learning model 432 (e.g., machine learning model 432 obtained from machine learning model 422). In another embodiment, the output of the machine learning model 432 includes overlay results 433 (e.g., measured output p*). This process can be described as $p^*=f^{-1}\circ\tilde{S}$, where $\tilde{S}$ is a vector consisting of the signals for all wavelengths.

It is noted herein that the dimensionality reduction technique such as the principal component analysis can be used to compress matrix S. In this regard, it is noted that the number of features, and hence the number of the parameters, in the machine learning model can be greatly reduced. Moreover, principal component analysis may also introduce regularization in the model to some degree. A more detailed description of the use of principal component analysis in reducing the dimensionality of signal matrix S in scatterometry can be found in U.S. Published Patent Application No. 2013/0110477 to Pandev, which was published on May 2, 2013. This patent application is incorporated herein by reference in the entirety.

It is further noted that the various embodiments of the systems, methods, and algorithms described herein are for illustrative purposes only, and are not intended to limit the scope of the present disclosure to the particular embodiments described. Therefore, the overlay metrology systems, methods, and algorithms described herein are not intended to be limited to the particular embodiments shown and described, but are to be accorded the widest scope consistent with the principles and novel features herein disclosed.

For example, any combination of the following instruments may be used to measure optical signals for a plurality of periodic targets that each have a first structure formed on a first layer and a second structure formed on a second layer of a sample, wherein there are predefined offsets between the first and second structures: an imaging reflectometer, an imaging spectroscopic reflectometer, a polarized spectroscopic imaging reflectometer, a scanning reflectometer system, a system with two or more reflectometers capable of parallel data acquisition, a system with two or more spectroscopic reflectometers capable of parallel data acquisition, a system with two or more polarized spectroscopic reflectometers capable of parallel data acquisition, a system with two or more polarized spectroscopic reflectometers capable of serial data acquisition without moving the stage apparatus or moving any optical elements or the reflectometer stage, imaging spectrometers, an imaging system with wavelength filter, an imaging system with long-pass wavelength filter, an imaging system with short-pass wavelength filter, an imaging system without wavelength filter, an interferometric imaging system, an imaging ellipsometer, an imaging spectroscopic ellipsometer, a scanning ellipsometer system, a system with two or more ellipsometers capable of parallel data acquisition, a system with two or more ellipsometers capable of serial data acquisition without moving the wafer stage or moving any optical elements or the ellipsometer stage, a Michelson interferometer, a Mach-Zehnder interferometer, a Sagnac interferometer, a scanning angle of incidence system, and a scanning azimuth angle system.

Figure 5:
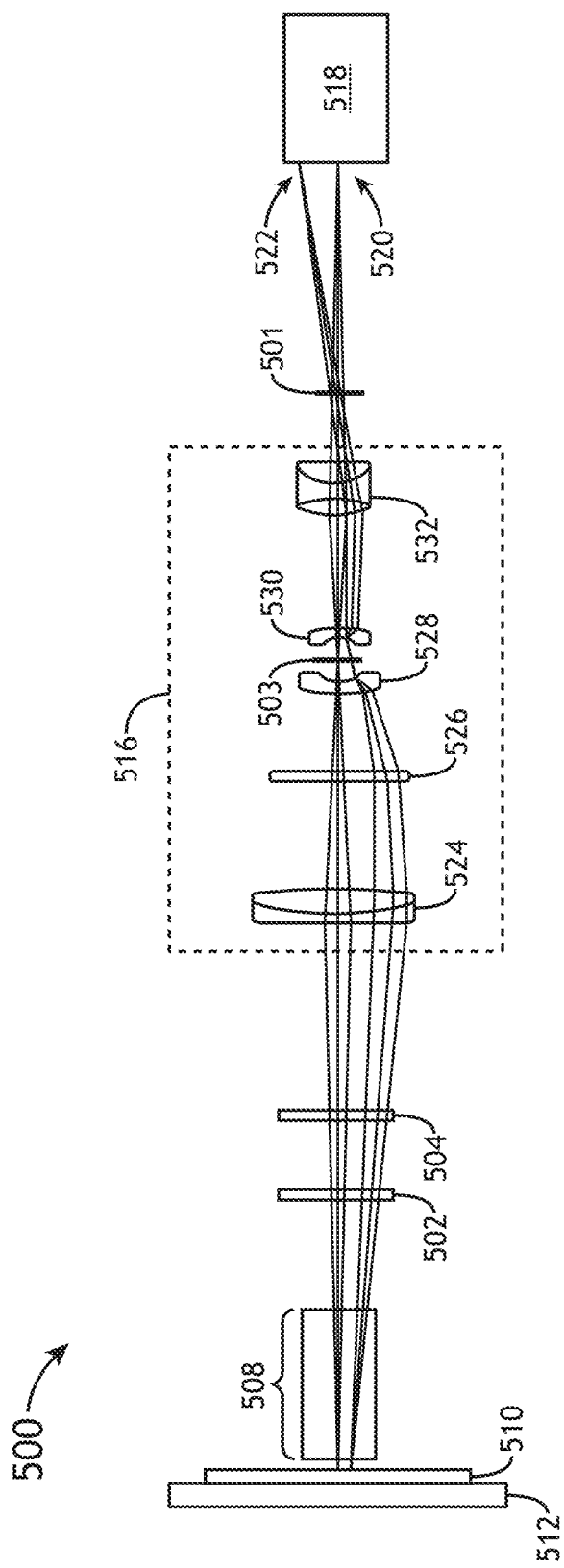
FIG. 5 illustrates a simplified schematic view of an overlay metrology system including a high-quality microscope objective lens and a tube lens, in accordance with one or more embodiments of the present disclosure.

FIG. 5 illustrates a simplified schematic view of an overlay metrology system 500 including a high-quality microscope objective lens 508 and a tube lens 516, in accordance with one or more embodiments of the present disclosure. In one embodiment, metrology system 500 includes a tube lens 516, a microscope objective lens 508, and a detector assembly 518. In another embodiment, system 500 is configured to measure or inspect a sample 510. It is noted herein that the description associated with systems 100, 200 of FIGS. 1 and 2 may be regarded as applying to metrology system 500 of FIG. 5, unless noted otherwise herein.

In one embodiment, metrology system 500 resembles an epi-illuminated microscope, including a microscope objective lens 508 and a tube lens 516. An overlay target on a surface of sample 510 is imaged by objective lens 508 onto a detector assembly 518. Detector assembly 518 may include any detector assembly known in the art including, but not limited to, a CCD, an image sensor, and a spectrometer. In one embodiment, the optical elements of metrology system 500 are designed to minimize chromatic and asymmetric aberrations to enable an accurate overlay measurement.

In one embodiment, illumination is directed through the objective lens 508 and focused onto the surface of the sample 510. In another embodiment, objective lens 508 is a high numerical-aperture (NA) objective lens (i.e. having an NA of approximately 0.9 or greater). In this regard, the rays of illumination emanating from objective lens 508 onto the sample 510 fill a relatively large cone angle. A 0.9 NA is equivalent to a maximum cone half-angle of the rays hitting the sample 510 of arcsin $(0.90) \approx 64°$. Therefore, high-NA objective lenses have relatively large entrance pupils. In addition to the higher spatial resolution image compared with a low NA objective lens, a further advantage of using a high NA objective lens 508 is that different portions of the entrance pupil may be used for illumination depending on the structure being measured. In this regard, the fact that the entrance pupil (e.g., the illumination pupil) is relatively large enables selective illumination of sub-areas of the pupil, which then translate into subsets of the possible illumination angles provided by the overall numerical-aperture (NA) of objective lens 508.

When system 500 is being used for overlay metrology, objective lens 508 may be telecentric at sample 510 and may have very low lateral chromatic aberrations (e.g., less than approximately 20 nm of lateral chromatic aberration across the field of view corresponding to structure being measured, preferably less than approximately 10 nm). In one embodiment, the telecentricity of objective lens 508 may be less than 5 mrad (milli-radians). By way of example, the telecentricity of objective lens 508 may be approximately 2 mrad or less over the whole wavelength range of intended operation (typically a wavelength range spanning at least 400 nm to 800 nm). For overlay metrology, measurements are usually made on structures with lateral dimensions between approximately 5 µm and approximately 40 µm. In this regard, the aberration specifications are most critical for a central portion of the field of view of objective lens 508 with lateral dimensions between 10 µm and 50 µm. This central portion of the field of view of objective lens 508 is referred to herein as the "critical field of view." It may be appreciated that outer regions of objective lens 508 which are outside of the "critical field of view" are less critical, and larger aberrations in these outer regions may be tolerated. A more detailed description of objective lens 508 may be found in U.S. Pat. Nos. 7,245,438 and 7,474,461 to Chuang et al. These patents are incorporated herein by reference in the entirety.

In another embodiment, light reflected, diffracted, or scattered by sample 510 is collected by objective lens 508, which is configured to direct the collected illumination through beam splitters 502 and 504 to tube lens 516. In this regard, the two beamsplitters 502 and 504 are located in the optical path between objective lens 508 and tube lens 516. In one embodiment, a first beamsplitter (e.g., beamsplitter 502 or 504) may be configured to direct illumination from an illumination source (not shown) to objective lens 508 for epi-illumination. In another embodiment, a second beamsplitter (e.g., beamsplitter 502 or 504) may be configured the form the reference arm of a Linnik interferometer or, alternatively, to direct a portion of the illumination collected by objective lens 508 to an autofocus sensor. A more thorough explanation of beamsplitters 502, 504 may be found with reference to FIG. 1 and its associated description. It is noted that the elements depicted in FIG. 5, as well as its accompanying description, are illustrative and exemplary only. In this regard, alternative arrangements of optical elements may be implemented without departing from the spirit and scope of the present disclosure. For example, in an alternative embodiment, a single beamsplitter may be configured to perform the functions of beamsplitters 502 and 504.

In one embodiment, illumination reflected, diffracted, or scattered from sample 510 is directed through beamsplitters 502, 504 to tube lens 516. In one embodiment, tube lens 516 is configured to create an image of the surface of sample 510 on detector assembly 518. In another embodiment, tube lens 516 is configured to simultaneously create an image of the surface of sample 510 on the detector assembly 518 and create an image of the pupil stop of objective lens 508 at location 501. Tube lens 516 may be further configured to generate minimal lateral chromatic aberrations compared with those of objective lens 508 (i.e. lateral chromatic aberrations of tube lens 516 are a few nm or less for the critical field of view of objective lens 508). In one embodiment, tube lens 516 is configured such that the lateral chromatic aberrations of the image of the sample 510 surface and the lateral chromatic aberrations of the image at location 501 of the pupil stop are small (i.e. lateral chromatic aberrations of the image of the sample 510 surface are a few nm or less in the object plane for the critical field of view of objective lens 508, and the lateral chromatic aberrations of the image of the pupil stop are less than a few percent, such as about 1% or less, of the diameter of the image at location 501 of the pupil stop). In another embodiment, tube lens 516 is configured to generate minimal (i.e. less than approximately 200 µm or less than approximately 100 µm) axial chromatic aberrations for both the image on detector assembly 518 and the image of the pupil stop at location 501. In this embodiment, tube lens 516 causes, at most, minor changes in the axial chromatic aberration of objective lens 508, which is advantageous if objective lens 508 has low axial chromatic aberrations.

In another embodiment objective lens 508 is configured to have low lateral chromatic aberrations for both the image of the pupil stop at location 501 and the image on the detector assembly 518, and to have low axial chromatic aberration of the image on detector assembly 518, but to have axial chromatic aberrations of the image of the pupil at location 501 greater than 200 µm, possibly as large as a few mm (if not compensated for by tube lens 516). In this embodiment, tube lens 516 is configured to have low lateral chromatic aberrations for both the image of the pupil stop at location 501 and the image on detector assembly 518, and to have low axial chromatic aberration of the image on detector assembly 518, but to have axial chromatic aberrations of the image of the pupil that substantially cancel the axial chromatic aberrations of objective lens 508 of the image of the pupil stop (i.e. the resultant axial chromatic aberrations of the image of the pupil stop at location 501 due to the combination of objective lens 508 and tube lens 516 are less than approximately 200 µm or less than approximately 100 µm). The advantage of this embodiment is that objective lens 508 may be configured to simultaneously minimize lateral and axial chromatic aberrations of the image on detector assembly 518 and lateral chromatic aberrations of the image at location 501 of the pupil stop of objective lens 508 without the additional constraint of trying to also simultaneously minimize the axial chromatic aberrations of the image at location 501 of the pupil stop of objective lens 508. Since the image of the pupil stop at location 501 will typically have a diameter of approximately 10 mm, the lateral chromatic aberrations of the image of the pupil stop should be small compared with manufacturing tolerances of apertures that may be placed at this location (i.e. less than 100 µm for a 10 mm diameter image, less than approximately 50 µm, or less than approximately 20 µm). Advantageously, this configuration may result in overall lower levels of chromatic aberrations of metrology system 500.

It is noted herein that both embodiments described above may allow for broadband axial chromatic correction while simultaneously achieving low levels of lateral chromatic aberrations. In addition, metrology system 500 comprising objective lens 508 and tube lens 516 is corrected for both image and pupil chromatic aberrations. It is further noted that the location 501 of the image of the pupil stop of objective lens 508 does not shift for different wavelengths when the objective lens 508 and tube lens 516 are configured as described herein. While conventional tube lenses may correct axial chromatic aberrations, the lateral chromatic aberrations of the tube lens 516 may be worse than those of the objective lens 508. Furthermore, a conventional tube lens may correct lateral and axial aberrations of the image on detector assembly 518, but fail to correct (or may introduce) aberrations of the image at location 501 of the pupil stop. Comparatively, system 500 of the present disclosure may allow the lateral chromatic aberration of the objective lens 508 to be reduced to just a few nm or smaller, because axial chromatic aberration of either, or both, the image and the pupil of a few hundred µm can be tolerated, due to the fact that tube lens 516 may correct those axial chromatic aberrations without degrading the lateral chromatic aberrations.

In one embodiment, a beamsplitter or a flip-in mirror (not shown) is placed between tube lens 516 and detector assembly 518 to allow an image of a pupil stop (not shown) of objective lens 508 to be directed to a second detector (not shown). In another embodiment, system 500 includes a controller (not shown) with one or more processors (not shown). In this embodiment, the one or more processors (not shown) may control insertion of a lens (not shown) into the illumination path between tube lens 516 and detector assembly 518, the lens configured to form an image of the pupil stop of objective lens 508 onto detector assembly 518.

Continuing with reference to FIG. 5, FIG. 5 illustrates a metrology system 500 configured to simultaneously achieve low lateral and axial chromatic aberrations of the image of the surface of sample 510 on detector assembly 518 and of the image at location 501 of the pupil stop of objective lens 508. In this embodiment, tube lens 516 includes multiple lens elements including doublet 524, lenses 526, 528, and 530, and triplet 532. In one embodiment, doublet 524, lens 526, and lens 528 are configured to create an intermediate image of the surface of the sample 510 at location 503. In another embodiment, lens 530 and triplet 532 are configured to create an image of the surface of sample 510 on detector assembly 518 with minimal aberrations (i.e. lens 530 and triplet 532 are configured to substantially cancel any aberrations of the intermediate image at location 503). It is noted that triplet 532 may contain a small air gap to give an extra degree of freedom in the configuration of tube lens 516.

A conventional tube lens might consist of a doublet or triplet (such as doublet 524) configured to create an intermediate image of the surface of the sample 510 at location 503, and another doublet or triplet (such as triplet 532) configured to create an image at the detector assembly 518 of the intermediate image at location 503. However, a conventional tube lens does not have sufficient degrees of freedom to be configured to simultaneously achieve low lateral and axial chromatic aberrations of the images of both the sample 510 surface and the pupil stop. Furthermore, a conventional tube lens may also not have sufficient degrees of freedom to be configured to place the image of the pupil stop at the desired location 501. In this regard, it is well known that a field lens may be placed at the location of an intermediate image (e.g., location 503) to change the location of an image of the pupil stop while causing a minimal shift in the location of the image at the detector assembly 518. However, a field lens has the well-known disadvantage that its surfaces would be substantially in focus on detector assembly 518 such that any imperfections on its surfaces degrade the quality of the image on detector assembly 518.

In one embodiment, tube lens 516 includes lenses 528 and 530 which are configured to control the location of the image of the pupil stop of objective lens 508 at location 501 while, in combination with the other lens elements, ensuring low lateral and axial chromatic aberrations of the pupil image at location 501 and the image on detector assembly 518. In one embodiment, as illustrated in FIG. 5, lens 530 is configured as a negative lens to ensure that a marginal ray and a chief ray pass through substantially opposite sides of lens 530 and triplet 532. In this regard, as illustrated, the chief ray passes through the lower sides of triplet 532 and lens 530, whereas the marginal ray passes through the upper sides of triplet 532 and lens 530. Comparatively, both the chief ray and the marginal ray pass through the same side of doublet 524 and lens 526 (i.e. the lower side as illustrated).

In one embodiment, ray bundle 520 depicts rays originating at the center of the field of view of objective lens 508. The rays in ray bundle 520 may be focused to the center of the image on detector assembly 518. In another embodiment, ray bundle 520 includes the marginal ray, which is the ray from the center of the field of view that just touches the pupil stop of objective lens 508.

In another embodiment, ray bundle 522 illustrates rays originating at one edge of the critical field of view of objective lens 508. The rays in ray bundle 522 may be focused to a point lying away from the center of the image on detector assembly 518. In one embodiment, ray bundle 522 includes the chief ray, which is a ray from the edge of the critical field of view of objective lens 508 that passes through the center of the pupil of objective lens 508 (i.e. the chief ray is the ray in the center of bundle 522 as illustrated). It is noted herein that the contribution of an optical surface to axial chromatic aberration is proportional to the square of the height of the marginal ray as it passes that surface, whereas the contribution of that surface to lateral chromatic aberration is proportional to the product of the heights of the marginal and chief rays as they pass that surface. In this regard, it is further noted that tube lens 516 may be configured to have minimal lateral and axial chromatic aberrations due to the opposite signs of the products of the heights of the marginal and chief rays on the lens elements on either side of the intermediate image at location 503 within tube lens 516.

Continuing with reference to FIG. 5, in another embodiment, tube lens 516 may be further configured such that the marginal ray passes close to the optical axis (e.g., center) of doublet 524 and lens 526, whereas the chief ray passes significantly further away from the optical axis. In this embodiment, tube lens 516 may be configured to create significant axial chromatic aberration (e.g., greater than approximately 100 μm) of the pupil image, while maintaining low lateral chromatic aberrations of both the pupil image at location 501 and the image on detector assembly 518, and low axial chromatic aberration of the image on detector assembly 518. In this embodiment, tube lens 516 is configured such that its pupil axial chromatic aberrations substantially cancel (e.g., reduce to less than approximately 200 μm or to less than approximately 100 μm) the axial pupil chromatic aberrations of objective lens 508. This reduction in pupil axial chromatic aberrations is possible because the roles of the marginal and chief rays are interchanged between the image of the surface of sample 510 and the image of the pupil. In other words, the marginal ray of the image of the surface of the sample 510 is the chief ray of the image of the pupil, and vice versa. In this regard, since tube lens 516 is configured with the image chief ray (i.e. the marginal ray of the pupil image) passing the surfaces of doublet 524 and lens 526 significantly displaced from the optical axis, an appropriate amount of pupil axial chromatic aberration may be created (to substantially cancel the corresponding aberration of objective lens 508) while keeping the other aberrations small.

In another embodiment, system 500 includes a field stop at location 503 configured to reject a portion of the collected illumination. This field stop may be inserted, removed, or adjusted via one or more processors of a controller, as shown in FIGS. 1 and 2. In this regard, the field stop at location 503 is used in the collection arm (e.g., collection arm 105, 205) of the metrology system. For scatterometry overlay systems, the field stop size may be optimized for a given size of target of the surface of sample 510, to tradeoff between signal contamination and pupil imaging resolution.

In one embodiment, an aperture in the illumination pupil may be configured to illuminate one subset of the angles of the numerical aperture of objective lens 508, while another aperture in the collection pupil at location 501 may be configured to collect illumination from a substantially non-overlapping subset of the angles of the numerical aperture. In this regard, diffracted or scattered illumination may be collected while substantially blocking the specular reflection, thereby creating a dark-field image. For example, substantial blocking may involve blocking at least 90% of the specularly reflected illumination power from the surface of sample 510.

As explained above in reference to FIG. 1, in one embodiment of inspection and/or metrology system 100, the illumination path may be configured with a tube lens similar to tube lens 516. In one embodiment, the tube lens in the illumination path may be configured with apertures at locations conjugate to locations 501 and/or 503, which may further be controlled by the one or more processors 122 of controller 120. The one or more processors 122 of controller 120 may control the apertures in the illumination and collection paths to increase the sensitivity of inspection or metrology system 100 to features of interest, while decreasing sensitivity of other features of the sample 110 which are not of interest, such as variations of the thicknesses of film layers.

Figure 6:
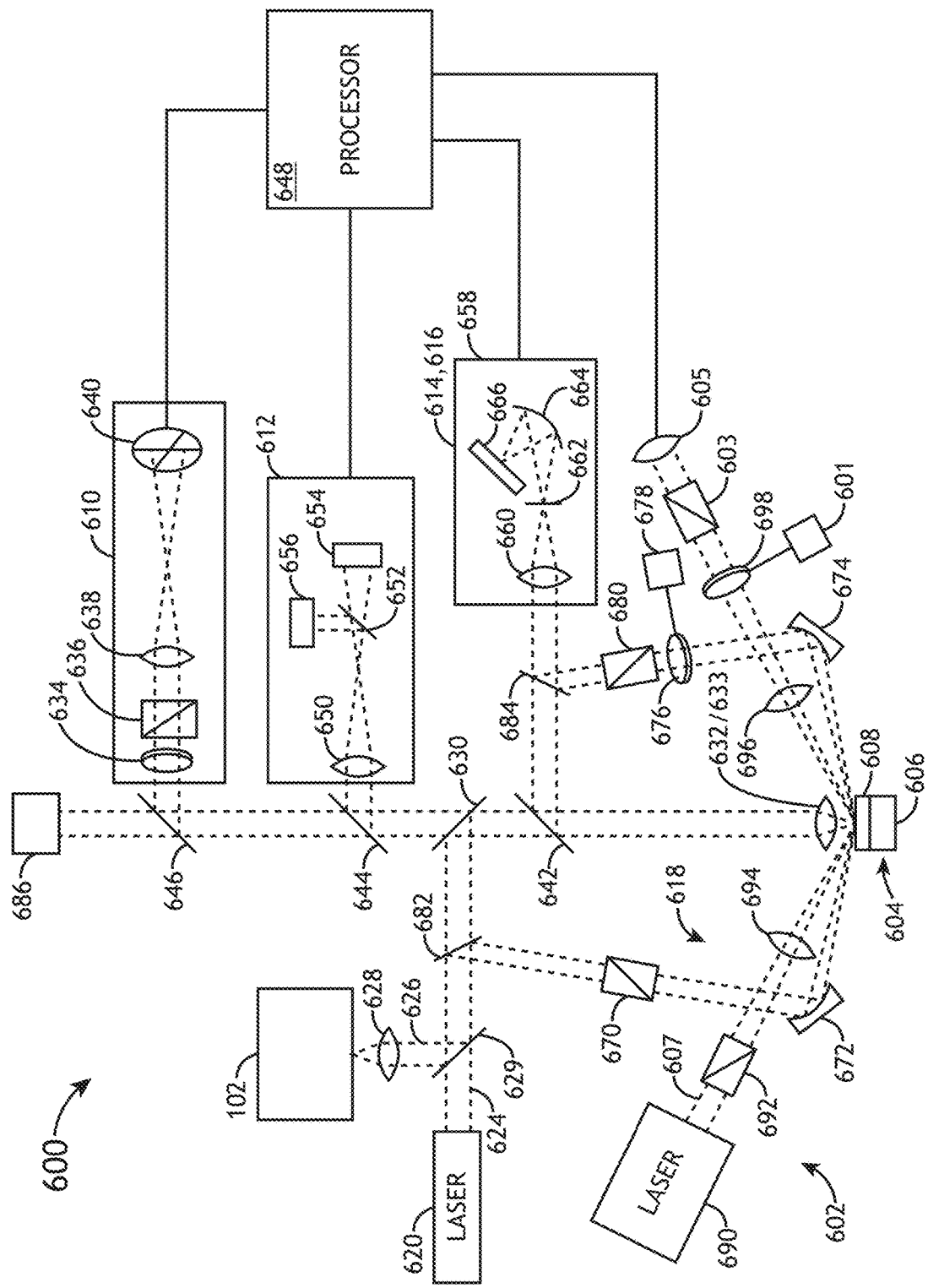
FIG. 6 illustrates a simplified schematic view of a metrology system including multiple measurement sub-systems, in accordance with one or more embodiments of the present disclosure.

FIG. 6 illustrates a simplified schematic view of a metrology system 600 including multiple measurement sub-systems, in accordance with one or more embodiments of the present disclosure. It is contemplated herein that system 600 may be configured to implement one or more of the systems, algorithms, or embodiments disclosed herein.

In one embodiment, metrology system 600 includes optical measurement devices, including a Beam Profile Ellipsometer (BPE) 610, a Beam Profile Reflectometer (BPR) 612, a Broadband Reflective Spectrometer (BRS) 614, a Deep Ultra Violet Reflective Spectrometer (DUV) 616, a Broadband Spectroscopic Ellipsometer (BSE) 618, and a reference ellipsometer 602. In another embodiment, system 600 includes laser 620, laser 690, and illumination source 102. In another embodiment, laser 620 may generate a probe beam 624, and illumination source 102 may generate probe beam 626. Probe beam 626 may be collimated by lens 628 and directed along the same path as probe beam 624 by mirror 629. In one embodiment, laser 620 includes a solid state laser diode which emits a linearly polarized 3 mW beam at a visible or near IR wavelength such as a wavelength near 670 nm. In another embodiment, illumination source 102 includes a broad-band, laser-pumped plasma lamp that produces a polychromatic beam which covers a spectrum of approximately 200 nm to 800 nm or broader. In another embodiment, the probe beams 624, 626 are reflected by mirror 630, and pass through mirror 642 to a sample 604.

In one embodiment, probe beams 624, 626 are focused onto the surface of the sample 604 by one or more objective lenses. For example, the one or more objective lenses may include lens 632 and/or lens 633. In another embodiment, two lenses (e.g., lens 632, 633) are mounted in a turret (not shown) and are alternatively movable into the path of probe beams 624, 626. In one embodiment, lens 632 is a microscope objective lens with a high numerical aperture (on the order of 0.90 NA) to create a large spread of angles of incidence with respect to the sample 604 surface. In another embodiment, lens 632 is configured to create a spot size of approximately one micron in diameter. In another embodiment, lens 633 is a reflective lens having a lower numerical aperture (on the order of 0.1 to 0.4 NA) and capable of focusing deep UV light to a spot size of approximately 10-15 microns.

Beam profile ellipsometry (BPE) is discussed in U.S. Pat. No. 5,181,080, issued Jan. 19, 1993, which is incorporated herein by reference in the entirety. In one embodiment, BPE 610 includes a quarter wave plate 634, a polarizer 636, a lens 638, and a quad sensor 640. In operation, linearly polarized probe beam 624 is focused onto sample 604 by lens 632. Light reflected from the sample 604 surface passes up through lens 632, through mirrors 642, 630, and 644, and is directed into BPE 610 by mirror 646. The positions of the rays within the reflected probe beam correspond to specific angles of incidence with respect to the sample 604 surface. Quarter-wave plate 634 retards the phase of one of the polarization states of the beam by 90 degrees. Linear polarizer 636 causes the two polarization states of the beam to interfere with each other. For maximum signal, the axis of the polarizer 636 should be oriented at an angle of 45 degrees with respect to the fast and slow axis of the quarter-wave plate 634.

In one embodiment, sensor 640 of BPE 610 is a quad-cell sensor with four radially disposed quadrants that each intercept one quarter of the probe beam 624 and generate a separate output signal proportional to the power of the portion of the probe beam 624 striking that quadrant. In another embodiment, the output signals from each quadrant are transmitted to one or more processors 648. By monitoring the change in the polarization state of the beam, ellipsometric information, such as ψ and Δ, can be determined, as discussed in U.S. Pat. No. 5,181,080, which is incorporated herein by reference in the entirety.

In one embodiment, BPR 612 includes a lens 650, a beam splitter 652, and two linear sensor arrays 654, 656 to measure the reflectance of the sample 604. In operation, as linearly polarized probe beam 624 is focused onto sample 604 by lens 632, various rays within the probe beam 624 strike the sample 604 surface at a range of angles of incidence. Light reflected from the sample 604 surface passes up through lens 632, through mirrors 642, 630, and is directed into BPR 612 by mirror 644. Beam profile reflectometry (BPR) is discussed in further detail in U.S. Pat. No. 4,999,014, issued on Mar. 12, 1991, which is incorporated herein by reference in the entirety.

In one embodiment, the positions of the rays within the reflected probe beam 624 correspond to specific angles of incidence with respect to the sample 604 surface. In another embodiment, lens 650 of BPR 612 spatially spreads the beam two-dimensionally. In another embodiment, beam splitter 652 separates the s and p components of the beam, and sensor arrays 654, 656 are oriented orthogonal to each other to isolate information about s and p polarized light. The rays corresponding to the higher angles of incidence will fall closer to the opposed ends of the sensor arrays 654, 656. The output from each element of the sensor arrays 654, 656 correspond to different angles of incidence. Sensor arrays 654, 656 measure the intensity across the reflected probe beam 624 as a function of the angle of incidence with respect to the sample 604 surface. In one embodiment, sensor arrays 654, 656 may comprise one or more line sensors.

In another embodiment, the one or more processors 648 receive the output of the sensor arrays 654, 656 and derive the thickness and refractive index of the thin film layer 608 of the sample 604 based on the angular dependent intensity measurements. In another embodiment, the one or more processors 648 derive the thickness and refractive index of the thin film layer 608 by utilizing various types of modeling algorithms. For example, the one or more processors 648 may utilize optimization routines which use iterative processes such as least square fitting routines. One example of this type of optimization routine is described in "Multiparameter Measurements of Thin Films Using Beam-Profile Reflectivity," Fanton et al., Journal of Applied Physics, Vol. 73, No. 11, p. 7035, 1993. Another example appears in "Simultaneous Measurement of Six Layers in a Silicon on Insulator Film Stack Using Spectrophotometry and Beam Profile Reflectometry," Leng et al., Journal of Applied Physics, Vol. 81, No. 8, page 3570, 1997. Both of these publications are incorporated herein by reference in the entirety.

In one embodiment, Broadband Reflective Spectrometer (BRS) 614 simultaneously probes the sample 604 with multiple wavelengths of light. In another embodiment, BRS 614 includes a broadband spectrometer 658. Broadband spectrometer 658 may include any type of broadband spectrometer known in the art. In another embodiment, broadband spectrometer 658 includes a lens 660, an aperture 662, a dispersive element 664, and sensor array 666. During operation, probe beam 626 from illumination source 102 is focused onto sample 604 by lens 632. Light reflected from the surface of the sample 604 passes up through lens 632, and is directed by mirror 642 through mirror 684 to the broadband spectrometer 658. The lens 660 focuses the probe beam through aperture 662, which defines a spot in the field of view on the sample 604 surface to analyze.

In one embodiment, dispersive element 664 angularly disperses the beam as a function of wavelength to individual sensor elements contained in the sensor array 666. The different sensor elements of the sensor array 666 may measure the optical intensities of the different wavelengths contained in the probe beam, preferably simultaneously. In another embodiment, sensor array 666 comprises a line sensor. It is noted herein that the dispersive element 664 may include, but is not limited to, a diffraction grating, a prism, a holographic plate, and the like. In one embodiment, dispersive element 664 is configured to disperse the light as a function of wavelength in one direction, and as a function of the angle of incidence with respect to the sample 604 surface in an orthogonal direction, so that simultaneous measurements as a function of both wavelength and angle of incidence are possible. In this embodiment, sensor array 666 may comprise a line sensor configured to simultaneously collect 2 or 3 spectra, each spectrum corresponding to a different range of angles of incidence. In another embodiment, the one or more processors 648 process the intensity information measured by the sensor array 666.

In one embodiment, system 600 includes deep ultra violet reflective spectrometry (DUV) 616. In one embodiment, DUV 616 simultaneously probes the sample 604 with multiple wavelengths of ultra-violet light. It is noted that DUV 616 may use the same broadband spectrometer 658 to analyze probe beam 626 as BRS 614, wherein DUV 616 uses the reflective lens 633 instead of focusing lens 632. In this regard, in order to operate DUV 616, the turret (not shown) containing lenses 632, 633 may be rotated so that reflective lens 633 is aligned in probe beam 626. It is noted herein that reflective lens 633 may be necessary because solid objective lenses cannot sufficiently focus the UV light onto the sample 604.

Broadband spectroscopic ellipsometry (BSE) is discussed in U.S. Pat. No. 5,877,859, issued on Mar. 2, 1999 to Aspnes et al., which is incorporated herein by reference in the entirety. In one embodiment, BSE 618 includes a polarizer 670, a focusing mirror 672, a collimating mirror 674, a rotating compensator 676, and an analyzer 680. In operation, mirror 682 directs at least part of probe beam 626 to polarizer 670, which creates a known polarization state for the probe beam 626. In another embodiment, polarizer 670 creates a linear polarization state. In another embodiment, mirror 672 focuses the probe beam 626 onto the sample 604 surface at an oblique angle, ideally on the order of 70 degrees to the normal of the sample 604 surface.

Based upon well-known ellipsometric principles, as well as the composition and thickness of the film 608 and substrate 606 of the sample 604, the reflected beam will generally have a mixed linear and circular polarization state after interacting with the sample 604. In another embodiment, the reflected beam is collimated by mirror 674, which directs the beam to the rotating compensator 676. Compensator 676 may introduce a relative phase delay δ (phase retardation) between a pair of mutually orthogonal polarized optical beam components. In another embodiment, compensator 676 is rotated at an angular velocity w about an axis substantially parallel to the propagation direction of the beam, preferably by an electric motor 678. In another embodiment, analyzer 680 mixes the polarization states incident on it. In one embodiment, analyzer 680 is a linear polarizer. It is noted herein that measuring the light transmitted by analyzer 680 allows the polarization state of the reflected probe beam to be determined. In another embodiment, mirror 684 directs the beam to spectrometer 658, which simultaneously measures on sensor 666 the intensities of the different wavelengths of light in the reflected probe beam 656 that pass through the compensator/analyzer combination. As noted previously herein, sensor 666 may comprise a line sensor. In another embodiment, the one or more processors 648 receive the output of the sensor 666, and process the intensity information measured by the sensor 666 as a function of wavelength and as a function of the azimuth (rotational) angle of the compensator 676 about its axis of rotation in order to solve for sample characteristics, such as the ellipsometric values LP and A, as described in U.S. Pat. No. 5,877,859.

In another embodiment, a detector 686 is positioned above mirror 646, and can be used to view beams reflected off of the sample 604 for alignment and focusing purposes.

In one embodiment, in order to calibrate BPE 610, BPR 612, BRS 614, DUV 616, and BSE 618, metrology system 600 includes the wavelength stable calibration reference ellipsometer 602 that may be used in conjunction with a reference sample 604. In another embodiment, ellipsometer 602 includes a light source 690, a polarizer 692, lenses 694, 696, a rotating compensator 698, an analyzer 603, and a detector 605.

In one embodiment, light source 690 produces a quasi-monochromatic probe beam 607 having a known stable wavelength and stable intensity. The wavelength of beam 607, which is a known constant or a measured value, is provided to the one or more processors 648 so that ellipsometer 602 may accurately calibrate the optical measurement devices in system 600.

In one embodiment, beam 607 interacts with polarizer 692 to create a known polarization state. In another embodiment, polarizer 692 is a linear polarizer made from a quartz Rochon prism, but in general the polarization does not necessarily have to be linear, nor even complete. It is noted herein that polarizer 692 may also be made from calcite. In one embodiment, the azimuth angle of polarizer 692 is oriented such that the plane of the electric vector associated with the linearly polarized beam exiting from the polarizer 692 is at a known angle with respect to the plane of incidence, wherein the plane of incidence is defined by the propagation direction of the beam 607 and the normal to the surface of sample 604. It is noted herein that sensitivity is optimized when the reflected intensities of the P and S polarized components are approximately balanced. In this regard, the azimuth angle may be selected to be on the order of 30 degrees. It is further noted herein that polarizer 692 may be omitted if the light source 690 emits light with the desired known polarization state.

In one embodiment, beam 607 is focused onto the sample 604 by lens 694 at an oblique angle. The beam 607 is ideally incident on sample 604 at an angle on the order of 70 degrees to the normal of the sample 604 surface due to the fact that sensitivity to sample 604 properties is maximized in the vicinity of the Brewster or pseudo-Brewster angle of a material. Based upon well-known ellipsometric principles, the reflected beam will generally have a mixed linear and circular polarization state after interacting with the sample 604, as compared to the linear polarization state of the incoming beam.

In one embodiment, lens 696 collimates beam 607 after its reflection off the sample 604. The beam 607 then passes through the rotating compensator (retarder) 698, which introduces a relative phase delay Or (phase retardation) between a pair of mutually orthogonal polarized optical beam components. The amount of phase retardation may be a function of the wavelength, the dispersion characteristics of the material used to form the compensator 698, and the thickness of the compensator 698. In one embodiment, compensator 698 is rotated at an angular velocity $\omega_r$ about an axis substantially parallel to the propagation direction of beam 607, preferably by an electric motor 601. It is noted herein that compensator 698 may include conventional wave-plate compensator. For example, compensator 698 may include a conventional wave-plate compensator made of crystal quartz. In another embodiment, the thickness and material of the compensator 698 are selected such that a desired phase retardation of the beam is induced. It is noted herein that a phase retardation of around 90 degrees is convenient.

In another embodiment, following interaction with compensator 698, beam 607 then interacts with analyzer 603, which serves to mix the polarization states incident on it. In one embodiment, analyzer 603 is another linear polarizer, oriented at an azimuth angle of 45 degrees relative to the plane of incidence. It is noted herein that analyzer 603 may include any optical device that serves to appropriately mix the incoming polarization. For example, analyzer 603 may include a quartz Rochon or Wollaston prism.

It is noted herein that the compensator 698 may be located either between the sample 604 and the analyzer 603, or between the sample 604 and the polarizer 692. It is further noted herein that polarizer 670, lenses 694, 696, compensator 698, and polarizer 692 may all be optimized in their construction for the specific wavelength of light produced by light source 690, which may maximize the accuracy of ellipsometer 602.

In another embodiment, beam 607 enters detector 605, which measures the intensity of the beam 607 passing through the compensator/analyzer combination. In another embodiment, the one or more processors 648 process the intensity information measured by the detector 605 to determine the polarization state of the light after interacting with the analyzer 603, and therefore the ellipsometric parameters of the sample 604. This information processing carried out by the one or more processors 648 may include measuring beam intensity as a function of the azimuth (rotational) angle of the compensator 698 about its axis of rotation. It is noted herein that, because the compensator 698 angular velocity is typically known and constant, the measurement of intensity as a function of compensator 698 rotational angle is effectively a measurement of the intensity of beam 607 as a function of time.

Metrology system 600 is described in further detail in U.S. Pat. No. 6,297,880, which issued on Oct. 2, 2001 to Rosencwaig et al., which is incorporated herein by reference in the entirety. U.S. Pat. No. 6,429,943, which issued on Aug. 6, 2002 to Opsal et al. and is incorporated herein by reference in the entirety, describes how metrology system 600 may be used for scatterometry measurements. U.S. Pat. No. 5,608,526, which issued on Mar. 4, 1997 to Piwonka-Corle et al. and is incorporated herein by reference in the entirety, describes an alternative embodiment of metrology system 600 that incorporates a spectroscopic ellipsometer and a spectrophotometer. It is further noted herein that either, or both, of the spectroscopic ellipsometer and spectrophotometer may be used in methods of measuring a sample described herein.

The various embodiments of the structures and methods of this invention that are described above are illustrative only of the principles of this invention and are not intended to limit the scope of the invention to the particular embodiments described. For example, any combination of the following instruments may be used to measure optical signals for a plurality of periodic targets that each have a first structure formed from a first layer and a second structure formed from a second layer of the sample, wherein there are predefined offsets between the first and second structures: an imaging reflectometer, an imaging spectroscopic reflectometer, a polarized spectroscopic imaging reflectometer, a scanning reflectometer system, a system with two or more reflectometers capable of parallel data acquisition, a system with two or more spectroscopic reflectometers capable of parallel data acquisition, a system with two or more polarized spectroscopic reflectometers capable of parallel data acquisition, a system with two or more polarized spectroscopic reflectometers capable of serial data acquisition without moving the wafer stage or moving any optical elements or the reflectometer stage, imaging spectrometers, imaging system with wavelength filter, imaging system with long-pass wavelength filter, imaging system with short-pass wavelength filter, imaging system without wavelength filter, interferometric imaging system, imaging ellipsometer, imaging spectroscopic ellipsometer, a scanning ellipsometer system, a system with two or more ellipsometers capable of parallel data acquisition, a system with two or more ellipsometers capable of serial data acquisition without moving the wafer stage or moving any optical elements or the ellipsometer stage, a Michelson interferometer, and a Mach-Zehnder interferometer, a Sagnac interferometer, a scanning angle of incidence system, a scanning azimuth angle system. An overlay error is then determined between the first and second structures by analyzing the measured optical signals from the periodic targets.

The one or more processors 122, 222, 648 may include any one or more processing elements known in the art. In this sense, the one or more processors 122, 222, 648 may include any microprocessor-type device configured to execute software algorithms and/or instructions. In one embodiment, the one or more processors 122, 222, 648 may consist of a desktop computer, mainframe computer system, workstation, image computer, parallel processor, or other computer system (e.g., networked computer) configured to execute a program configured to operate the systems 100, 200, 500, 600 as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 122, 222, 648. In general, the term "processor" may be broadly defined to encompass any device having one or more processing elements, which execute program instructions from memory 124, 224. Moreover, different subsystems of the systems 100, 200, 500, 600 (e.g., detector assemblies 118, 218, sensors 119, 219, spectrometer 214, controllers 120, 220) may include processor or logic elements suitable for carrying out at least a portion of the steps described throughout the present disclosure. Therefore, the above description should not be interpreted as a limitation on the present disclosure but merely an illustration.

The memory 124, 224 may include any storage medium known in the art suitable for storing program instructions executable by the associated one or more processors 122, 222, 648. For example, the memory 124, 224 may include a non-transitory memory medium. For instance, the memory 124, 224 may include, but is not limited to, a read-only memory (ROM), a random access memory (RAM), a magnetic or optical memory device (e.g., disk), a magnetic tape, a solid state drive and the like. It is further noted that memory 124, 224 may be housed in a common controller housing with the one or more processors 122, 222, 648. In an alternative embodiment, the memory 124, 224 may be located remotely with respect to the physical location of the processors 122, 222, 648 controllers 120, 220. In another embodiment, the memory 124, 224 maintains program instructions for causing the one or more processors 122, 222, 648 to carry out the various steps described through the present disclosure.

In one embodiment, a user interface (not shown) is communicatively coupled to the controller 120, 220. In one embodiment, the user interface may include, but is not limited to, one or more desktops, tablets, smartphones, smart watches, or the like. In another embodiment, the user interface includes a display used to display data of the system 100, 200, 500, 600 to a user. The display of the user interface may include any display known in the art. For example, the display may include, but is not limited to, a liquid crystal display (LCD), an organic light-emitting diode (OLED) based display, or a CRT display. Those skilled in the art should recognize that any display device capable of integration with a user interface is suitable for implementation in the present disclosure. In another embodiment, a user may input selections and/or instructions responsive to data displayed to the user via the user interface.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

The invention claimed is:

1. A metrology system for measuring an overlay error of a sample comprising:
 a broadband illumination source configured to emit broadband illumination;
 one or more optical elements configured to direct the broadband illumination to a target disposed on the sample, wherein the one or more optical elements are configured to collect illumination from the target and direct it to a spectrometer, wherein the spectrometer is configured to disperse multiple wavelengths of the illumination collected from the sample to multiple elements of a sensor to generate a plurality of signals; and a controller configured to calculate an overlay error between a first structure and a second structure of the target by comparing the plurality of signals with a plurality of calculated signals, wherein the controller is further configured to adjust parameters of a model of the target to minimize a square difference $\Sigma_j[\tilde{S}(\lambda_j)-S(p, \lambda_j)]^2$, where $\tilde{S}(\lambda_j)$ represents the plurality of signals at the multiple wavelengths $\lambda_j$, j=1,2, ..., $n_\lambda$, and $S(p, \lambda_j)$ represents the plurality of calculated signals for parameters p.

2. The system of claim 1, wherein the controller is further configured to minimize the square difference using a Levenberg-Marquardt algorithm.

3. A method for determining an overlay error, comprising:
providing a sample with a plurality of periodic targets each having a first structure in a first layer and a second structure in a second layer, wherein there is at least one predefined offset between the first and second structures;
directing and focusing illumination onto the sample;
receiving illumination from the sample;
directing the received illumination to a spectrometer, wherein the spectrometer disperses the received illumination into a plurality of wavelengths that are directed to a sensor comprising a plurality of sensor elements that generate a plurality of signals corresponding to the plurality of wavelengths of the received illumination; and
calculating an overlay error between the first structure and the second structure by comparing the plurality of signals with a plurality of calculated signals, wherein calculating an overlay error by comparing the plurality of signals with the plurality of calculated signals comprises adjusting parameters of a model of the targets to minimize a square difference $\Sigma_j[\tilde{S}(\lambda_j)-S(p, \lambda_j)]^2$, where $\tilde{S}(\lambda_j)$ represents the plurality of signals at the plurality of wavelengths $\lambda_j$, j=1,2, ..., $n_\lambda$, and $S(p, \lambda_j)$ represents the plurality of calculated signals for parameters p.

4. The method of claim 3, wherein there are at least two predefined offsets between the first and second structures.

5. The method of claim 4, wherein calculating an overlay error by comparing the plurality of signals with a plurality of calculated signals comprises adjusting the parameters of a model of the targets to minimize a square difference $\Sigma_j[\tilde{S}(\lambda_j)-S(p, \lambda_j)]^2$, where $\tilde{S}(\lambda_j)$ represents the plurality of signals at the plurality of wavelengths $\lambda_j$, j=1,2, ..., $n_\lambda$, and $S(p, \lambda_j)$ represents the plurality of calculated signals for the parameters p.

6. The method of claim 3, wherein adjusting parameters p of a model of the targets to minimize the square difference uses a Levenberg-Marquardt algorithm.

7. A metrology system for measuring an overlay error of a sample, comprising:
a broadband illumination source;
an objective lens configured to focus illumination onto the sample and collect illumination from the sample, wherein the objective lens has a numerical aperture of 0.9 or higher, and the objective lens is configured to operate over a wavelength range from less than 400 nm to longer than 800 nm,
one or more illumination optical elements configured to direct the illumination from the broadband illumination source to the objective lens, wherein the one or more illumination optical elements comprise a first tube lens comprising one or more optical elements configured to form a first intermediate image within the first tube lens such that a chief ray of the broadband illumination and a marginal ray of the broadband illumination do not intersect within the first tube lens; and
one or more collection optical elements configured to direct illumination from the sample to a detector assembly, wherein the one or more collection optical elements comprise a second tube lens comprising one or more optical elements configured to form a second intermediate image within the first tube lens such that the chief ray of the broadband illumination and the marginal ray of the broadband illumination do not intersect within the second tube lens.

8. The metrology system of claim 7, wherein at least one of the first tube lens or the second tube lens further comprises a negative lens placed after the intermediate image formed in the tube lens containing the negative lens.

9. The metrology system of claim 8 wherein the metrology system further comprises:
an illumination pupil aperture configured to illuminate a first portion of the pupil of the objective lens; and
a collection pupil aperture configured to collect light from a second portion of the pupil of the objective lens, wherein the first and second portions of the pupil are substantially non-overlapping so that at least 90% of the power of a specular reflection from the sample is blocked.

10. The metrology system of claim 9, wherein the detector assembly comprises one of an image sensor and a spectrometer.

11. The metrology system of claim 9, wherein the detector assembly includes a spectrometer configured to disperse multiple wavelengths of the illumination collected from the sample to multiple elements of a sensor to generate a plurality of signals each signal corresponding to a different wavelength; and
wherein the metrology system further comprises a controller interoperably connected to the spectrometer and configured to calculate an overlay error between a first structure and a second structure of the target by comparing the plurality of signals with a plurality of calculated signals.

12. The metrology system of claim 11, wherein the controller is further configured to adjust parameters of a model of the targets to minimize a square difference $\Sigma_j[\tilde{S}(\lambda_j)-S(p, \lambda_j)]^2$, where $\tilde{S}(\lambda_j)$ represents the plurality of signals at the multiple wavelengths $\lambda_j$, j=1,2, ..., $n_\lambda$, and $S(p, \lambda_j)$ represents the plurality of calculated signals for parameters p.

13. The metrology system of claim 12, wherein the controller is further configured to minimize the square difference using a Levenberg-Marquardt algorithm.

14. The metrology system of claim 13, wherein the controller is further configured to calculate an overlay error by comparing the plurality of signals with the plurality of calculated signals using a machine-learning model that relates combinations of parameters $p_i$ to the plurality of calculated signals $S(p_i, \lambda_j)$ at the multiple wavelengths $\lambda_j$, j=1,2, ..., $n_\lambda$.

15. The metrology system of claim 14, wherein the controller is further configured to use principal component analysis to compress $S(p_i, \lambda_j)$.

16. The metrology system of claim 14, wherein the controller is further configured to use rigorous coupled-wave analysis (RCWA) to compute $S(p_i, \lambda_j)$.

17. The metrology system of claim 8, wherein the detector assembly comprises one of an image sensor and a spectrometer.

18. The metrology system of claim 7, wherein the objective lens includes a pupil, and wherein at least one of the first tube lens or the second tube lens is further configured to substantially correct broadband axial chromatic aberration in at least one of an image of the pupil and an image of the sample.

19. The metrology system of claim 18 wherein the metrology system further comprises:
an illumination pupil aperture configured to illuminate a first portion of the pupil of the objective lens; and
a collection pupil aperture configured to collect light from a second portion of the pupil of the objective lens, wherein the first and second portions of the pupil are substantially non-overlapping so that at least 90% of the power of a specular reflection from the sample is blocked.

20. The metrology system of claim 18, wherein the detector assembly comprises one of an image sensor and a spectrometer.

21. The metrology system of claim 7, wherein at least one of the first tube lens and the second tube lens is further configured to substantially correct broadband axial chromatic aberration in at least one of an image of the pupil and an image of the sample while substantially maintaining the lateral chromatic performance of the objective lens.

22. The metrology system of claim 21 wherein the metrology system further comprises:
an illumination pupil aperture configured to illuminate a first portion of the pupil of the objective lens; and
a collection pupil aperture configured to collect light from a second portion of the pupil of the objective lens, wherein the first and second portions of the pupil are substantially non-overlapping so that at least 90% of the power of a specular reflection from the sample is blocked.

23. The metrology system of claim 21, wherein the detector assembly comprises one of an image sensor and a spectrometer.

24. A metrology system for measuring an overlay error of a sample comprising:
a broadband illumination source configured to emit broadband illumination;
one or more optical elements configured to direct the broadband illumination to a target disposed on the sample, wherein the one or more optical elements are configured to collect illumination from the target and direct it to a spectrometer, wherein the spectrometer is configured to disperse multiple wavelengths of the illumination collected from the sample to multiple elements of a sensor to generate a plurality of signals; and
a controller configured to calculate an overlay error between a first structure and a second structure of the target by comparing the plurality of signals with a plurality of calculated signals, wherein the controller is further configured to calculate the overlay error by comparing the plurality of signals with the plurality of calculated signals using a machine-learning model that relates combinations of parameters $p_i$ to the plurality of calculated signals $S(p_i, \lambda_j)$ at the multiple wavelengths $\lambda_j$, $j=1,2,\ldots,n_\lambda$.

25. The system of claim 24, wherein the controller is further configured to use principal component analysis to compress $S(p_i, \lambda_j)$.

26. The system of claim 24, wherein the controller is further configured to use rigorous coupled-wave analysis (RCWA) to compute $S(p_i, \lambda_j)$.

27. A method for determining an overlay error, comprising:
providing a sample with a plurality of periodic targets each having a first structure in a first layer and a second structure in a second layer, wherein there is at least one predefined offset between the first and second structures;
directing and focusing illumination onto the sample;
receiving illumination from the sample;
directing the received illumination to a spectrometer, wherein the spectrometer disperses the received illumination into a plurality of wavelengths that are directed to a sensor comprising a plurality of sensor elements that generate a plurality of signals corresponding to the plurality of wavelengths of the received illumination; and
calculating an overlay error between the first structure and the second structure by comparing the plurality of signals with a plurality of calculated signals, wherein calculating an overlay error by comparing the plurality of signals with the plurality of calculated signals comprises using a machine-learning model that relates combinations of parameters $p_i$ to the plurality of calculated signals $S(p_i, \lambda_j)$ at the plurality of wavelengths $\lambda_j$, $j=1,2,\ldots,n_\lambda$.

28. The method of claim 27, the method further comprising using principal component analysis to compress $S(p_i, \lambda_j)$.

29. The method of claim 27, the method further comprising using rigorous coupled-wave analysis to calculate $S(p_i, \lambda_j)$.

* * * * *